United States Patent
Martin et al.

(10) Patent No.: US 8,861,337 B2
(45) Date of Patent: Oct. 14, 2014

(54) ROBUST COMMUNICATIONS IN ELECTRICALLY NOISY ENVIRONMENTS

(75) Inventors: Nathaniel Brian Martin, San Bruno, CA (US); Ian Casimir Dimen, San Francisco, CA (US)

(73) Assignee: Tesla Motors, Inc., Palo Alto, CA (US)

(*) Notice: Subject to any disclaimer, the term of this patent is extended or adjusted under 35 U.S.C. 154(b) by 292 days.

(21) Appl. No.: 13/572,665

(22) Filed: Aug. 12, 2012

(65) Prior Publication Data

US 2013/0294529 A1 Nov. 7, 2013

Related U.S. Application Data

(60) Provisional application No. 61/643,794, filed on May 7, 2012.

(51) Int. Cl.
*H04L 12/26* (2006.01)
*H03K 11/00* (2006.01)
*G06F 13/42* (2006.01)
*H04L 12/40* (2006.01)

(52) U.S. Cl.
CPC ...... *G06F 13/4247* (2013.01); *H04L 12/40052* (2013.01)
USPC ............................ 370/222; 370/406; 375/215

(58) Field of Classification Search
USPC ....................................................... 370/222
See application file for complete search history.

(56) References Cited

U.S. PATENT DOCUMENTS

| | | | |
|---|---|---|---|
| 4,159,470 A | 6/1979 | Froehling et al. | |
| 4,937,811 A | 6/1990 | Harris | |
| 6,600,790 B1 * | 7/2003 | Umemura et al. | 375/257 |
| 2006/0136604 A1 | 6/2006 | Schultze et al. | |
| 2008/0140892 A1 | 6/2008 | Fong et al. | |
| 2011/0285538 A1 | 11/2011 | Lee et al. | |
| 2012/0013201 A1 | 1/2012 | Pariseau et al. | |
| 2012/0076146 A1 | 3/2012 | Rohatschek et al. | |

FOREIGN PATENT DOCUMENTS

| | | |
|---|---|---|
| EP | 383946 | 8/1990 |
| EP | 428810 | 5/1991 |
| JP | 56020356 | 7/1979 |
| JP | 55110452 | 8/1980 |

OTHER PUBLICATIONS

European search report in application EP 13 16 6307, Sep. 27, 2013.
An Shi-Qi et al: "Design and realization of SPI interface in lithiumion battery voltage measuring system", 2006 IEEE Power Electronics Specialists Conference—Jun. 18-22, 2006—Jeju, South Korea, 2006 IEEE Power Electronics Specialists Conference (IEEE CAT. No. 06CH37819C)—2006—IEEEPiscataway, NJ, USA, pp. 83-87.
Dongping Xu et al: "Research on Li-ion Battery Management System", Electrical and Control Engineering (ICECE), 2010 International Conference on, IEEE, Piscataway, NJ, USA, pp. 4106-4109.
European Search Report in application 13166306, dated Sep. 11, 2013.
European Search Report in application 13166316, dated Jul. 29, 2013.
European Search Report in application 13166313, dated Oct. 2, 2013.
European Search Report in application 13166309, dated Sep. 16, 2013.

* cited by examiner

*Primary Examiner* — Shaq Taha
(74) *Attorney, Agent, or Firm* — J. Richard Soderberg

(57) ABSTRACT

A system and method for low-cost, fault tolerant, EMI robust data communications, particularly for an EV environment.

30 Claims, 15 Drawing Sheets

ROBUST COMMUNICATIONS IN ELECTRICALLY NOISY ENVIRONMENTS

CROSS REFERENCE TO RELATED APPLICATIONS

This application claims the benefit of U.S. Provisional Application No. 61/643,794, filed 7 May 2012, the contents of which are expressly incorporated by reference thereto in its entirety for all purposes.

The following applications are related to the present application, each also an application claiming benefit of U.S. Provisional Application No. 61/643,794, filed 7 May 2012 and filed on even date herewith, the contents of these applications are expressly incorporated by reference thereto in their entireties for all purposes: application Ser. No. 13/572,666 titled HOST COMMUNICATIONS ARCHITECTURE, application Ser. No. 13/572,667 titled REDUNDANT MULTI-STATE SIGNALING, application Ser. No. 13/572,668 titled WIRE BREAK DETECTION IN REDUNDANT COMMUNICATIONS, and application Ser. No. 13/572,669 titled HOST INITIATED STATE CONTROL OF REMOTE CLIENT IN COMMUNICATIONS SYSTEM.

BACKGROUND OF THE INVENTION

The present invention relates generally to data communications, and more specifically, but not exclusively, to low-cost, fault tolerant, EMI robust data communications for high performance electric vehicle (EV) environments.

Increasingly in vehicular and industrial applications, high energy electrical energy storage systems are used. Whether deployed to energize traction/propulsion motors, or factory machines, these energy storage systems often include many interconnected battery module assemblies, each module assembly including many individual battery storage cells. The interconnected modules collectively represent a unitary battery pack for the energy storage needs of the application.

Each module includes on-board electronics for safety and monitoring uses, and it is important that a centralized monitoring system reliably exchange data with these modules. The voltages and currents that exist in operation and control of the motors or machines produce conditions (e.g., voltage and current variations) that can interfere with the communications in a number of ways. The communication system must therefore be designed to operate satisfactorily in the presence of significant potential electromagnetic interference (both electromagnetic induction and electromagnetic radiation).

In the EV context, further boundary conditions include: a) low-cost solutions, b) reduced part/component solutions, c) low power consumption, and d) reliability appropriate for an automotive environment. The communications to and from the energy storage system includes safety-critical data and the automotive environment is harsh. The vehicle moves and is subject to mechanical bumps, shocks, and vibrations, under a range of temperature and humidity conditions. The modules are discrete elements and communications systems require wiring harnesses using wires and connectors. The wires and wire connectors/connections can break and/or they can become loose or provide intermittent connections, among other challenges.

What is needed is a system and method for low-cost, fault tolerant, EMI robust data communications, particularly for an EV environment.

BRIEF SUMMARY OF THE INVENTION

Disclosed is a system and method for low-cost, fault tolerant, EMI robust data communications.

The following summary of the invention is provided to facilitate an understanding of some of technical features related to low-cost, fault tolerant, EMI robust data communications in an electric vehicle (EV), and is not intended to be a full description of the present invention. A full appreciation of the various aspects of the invention can be gained by taking the entire specification, claims, drawings, and abstract as a whole. The present invention is applicable to other environments besides electric vehicles.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Embodiments of the present invention provide a system and method for low-cost, fault tolerant, EMI robust data communications. The following description is presented to enable one of ordinary skill in the art to make and use the invention and is provided in the context of a patent application and its requirements.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

There are many different sources and causes of electrical noise in most every operating environment. It is not always the case that the electrical noise interferes significantly with communications within that operating environment. Embodiments of the present invention are configured and implemented to provide robust communications in electrically noisy environments. For purposes of this application, an electrically noisy environment is one in which voltages induced or resulting from the electrical noise in the environment, as measured between nodes or points-under-test, are on the same order of the voltage levels used for data signaling. In the specific context of an application including an electrical motor, such as those used for propulsion in an electric vehicle (EV), there are significant time-varying magnetic fields present in regions of the EV that can generate significant noise (as voltages and/or currents).

Figure 1:
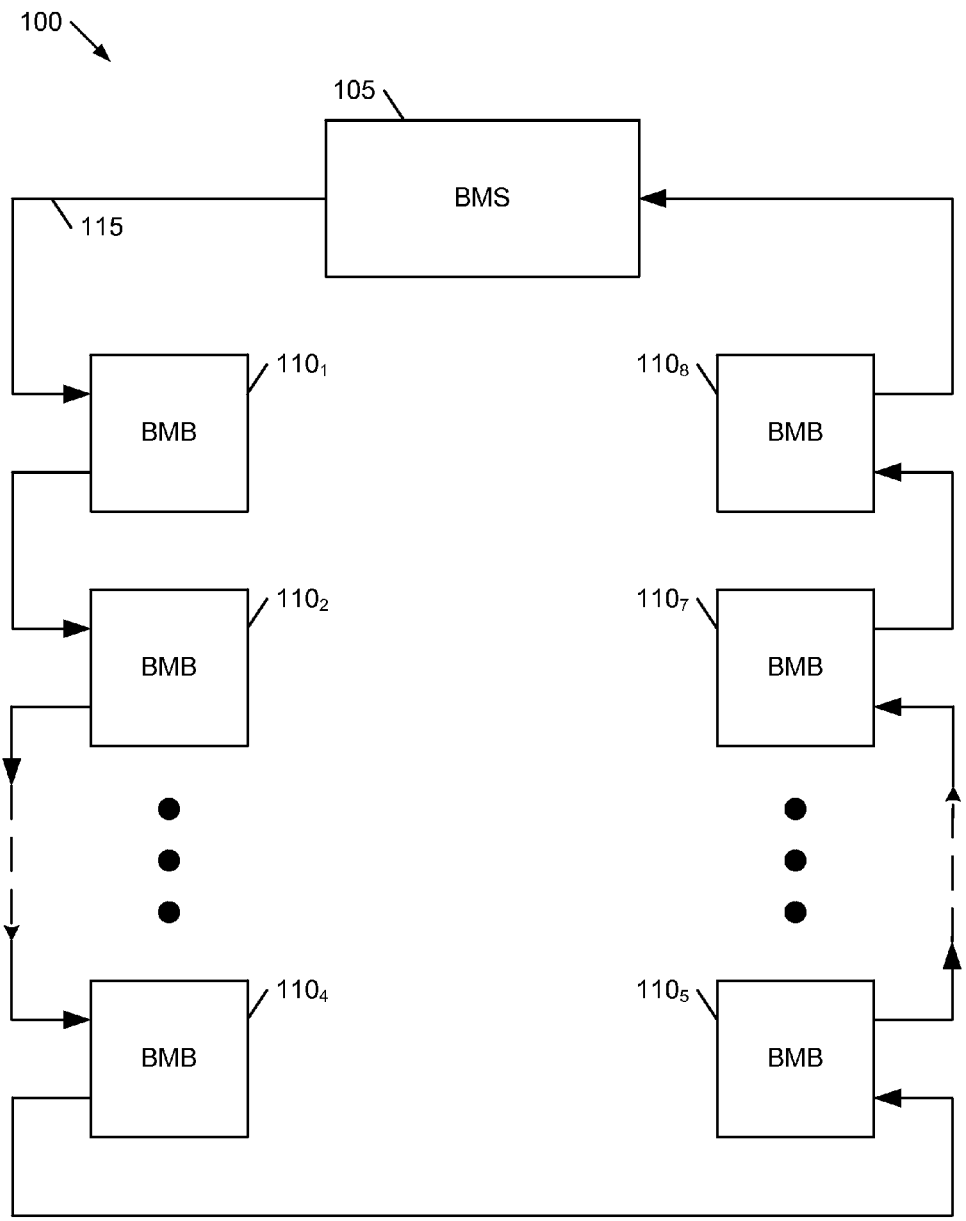
FIG. 1 illustrates a data flow schematic for a battery electronics system.

FIG. 1 illustrates a data flow schematic for a battery electronics system 100. Battery electronics system 100 includes a host 105 and a number N clients $110_i$, i=1 to N. There are many different possible implementations and arrangements of host 105 and clients $110_x$, all within the scope of the present invention. To simplify the discussion and as an aid in understanding, the following discussion focuses on a specific implementation in the context of an electric vehicle (EV) having a battery management system (BMS) and N=8 battery modules, each battery module including a battery module board (BMB). The BMS includes host 105 and each battery module board includes one client $110_i$, i=1 to 8.

Each client $110_x$ is implemented using commodity processors (e.g., 8-bit microcontrollers) and operates within an architecture designed with a minimal wire count to achieve the described features. Full functionality of battery electronics system 100 is maintained in the event of a single wire break or disconnect, with the system operating satisfactorily in the presence of EMI having relatively high slew rates.

For data transmissions, host 105 is connected to each client $110_x$ in a unidirectional daisy-chain loop 115 that begins, and ends, at host 105. Clients $110_x$ are numbered in order that they are connected on daisy-chain loop 115. Host 105 transmits all commands to a first client on daisy-chain loop 115 (i.e., client $110_1$ in FIG. 1). The general protocol provides that each client $110_i$ (e.g., client $110_4$) retransmits all data it receives on a byte-by-byte basis to a next client $110_{i+1}$ (i.e., client $110_5$). The last client in the loop (i.e., client $110_{N=8}$) transmits all data back to host 105. Thus in FIG. 1, host 105 always transmits data to client $110_1$ and receives from client $110_8$. Battery electronics system 100 does not require any particular connection order for battery modules, independent of the potential (e.g., the modules need not be connected in pack voltage order). Daisy-chain loops as used in conventional parlance includes wiring schemes in which multiple devices are wired together in a sequence or ring. As used herein, daisy-chain includes such wiring schemes, as well as other circular/sequenced wiring schemes in which digital data is regenerated or modified and analog signals are processed to counteract attenuation.

Figure 2:
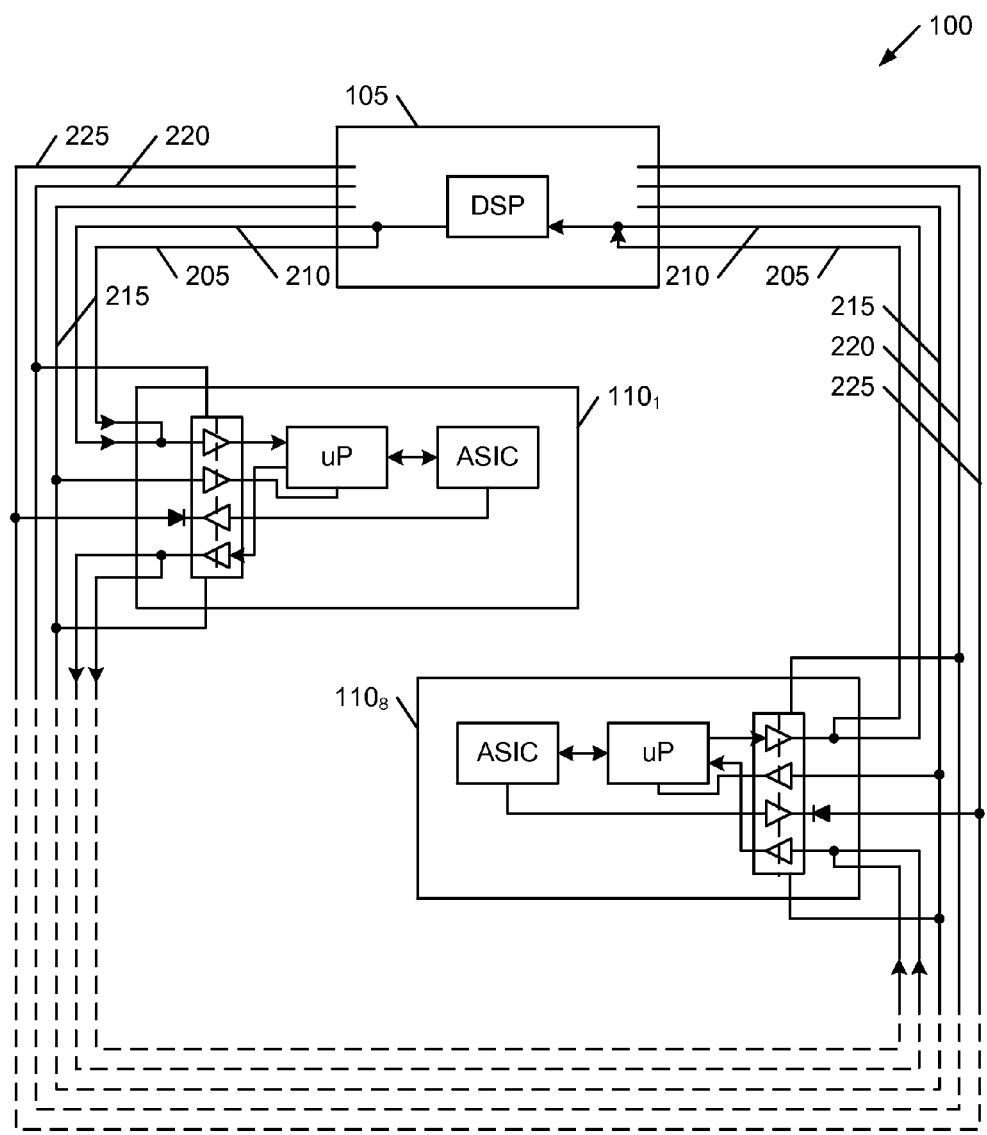
FIG. 2 illustrates a connections schematic for the battery electronics system.

FIG. 2 illustrates a connections schematic for battery electronics system 100. The connections architecture for battery electronics system 100 includes five wires, each wire is terminated at each client $110_x$. These five wires include: a first serial data wire 205, a second serial data wire 210 (for redundancy), an isolated power wire 215, an isolated ground wire 220, and a fault wire 225. Applications not requiring fault tolerance and redundant transmission methods use a minimum of three wires: power, ground, and serial data. Thus four logical wires connect each client (actually five wires are used because of the serial data redundancy). Host 105 and clients $110_x$ reliably transmit data over these wires in the presence of substantial EMI with each client powered by its associated battery module. Each battery module is part of a larger potential stack and has a different local ground than other battery modules. In the EV there is significant electrical switching noise, such as from a driver inverter, that creates the substantial EMI having three forms: switching transients, differential mode noise, and common mode noise.

Host 105 includes a digital signal processor (DSP) that is able to act as a universal asynchronous receiver/transmitter (UART) master. This DSP also determines the behavior of the battery, calculates a state of charge, and other battery metrics and conditions. Clients $110_x$ and the communications bus are some of the peripherals that the DSP employs to determine the correct behavior.

In the discussion herein a reference is made to a number of wires or wire count. Reduced wire count is not just desirable because of reduced component cost and decreased manufacturing costs, but also because of reliability. While FIG. 2 illustrates battery electronics system 100 having wire loops, these loops are actually collections of series of wire segments and connections that extend between host 105 and client $110_1$, between each client $110_x$, and client $110_{x+1}$, and between client $110_N$ and host 105. These wires have at least two points of connection per wire segment, if not more. Connections, whether using a connector or some joining technique (e.g., crimping), introduces points of potential failure having a greater risk of failure as compared to the possibility that the wire itself may fail. Each wire that is eliminated therefore can potentially increase reliability by a significant amount. Any wire that is added must be carefully considered.

Figure 3:
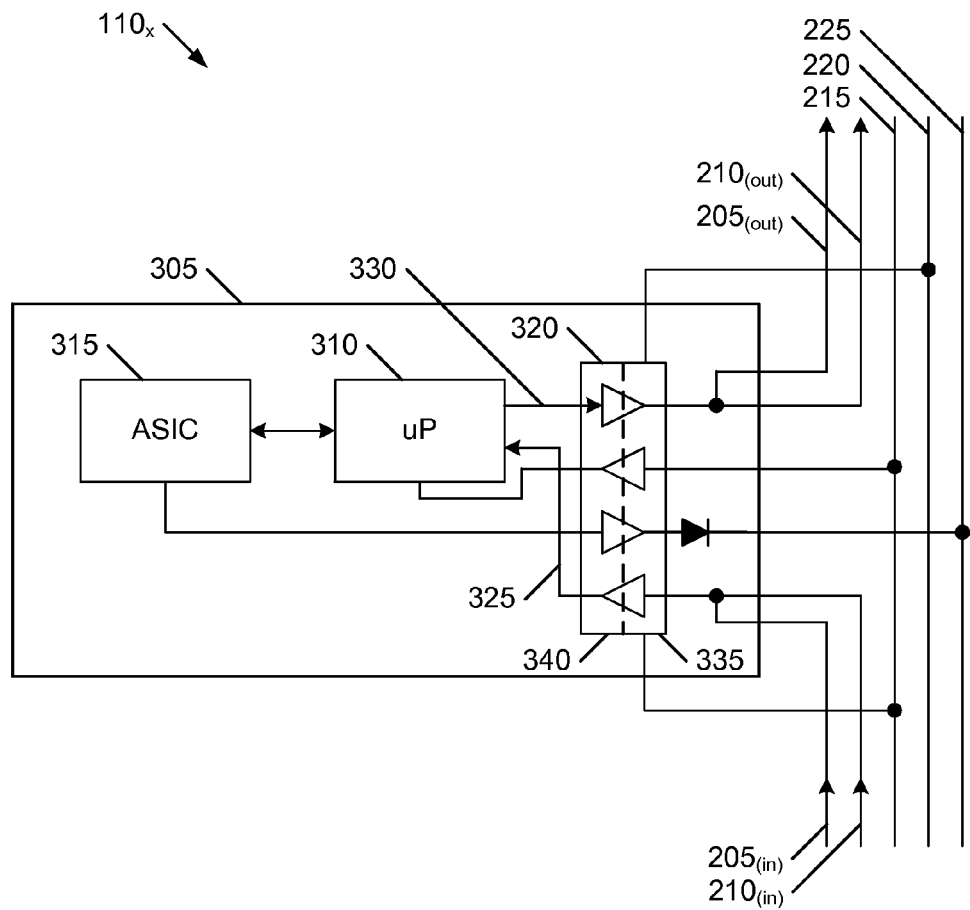
FIG. 3 illustrates a general schematic of components of a client.

FIG. 3 illustrates a general schematic of components included with each client $110_x$. Client $110_x$ includes a printed circuit board (PCB) 305 having a processor 310 (e.g., a commodity 8-bit microcontroller, or a microprocessor, or the like), an ASIC 315, and a set of isolators 320 that decouple on-board and off-board signals. PCB 305 includes a number of wire/connection traces that interconnect the components. The interconnections are taken to be reliable in this application so that the redundancy of the serial data wires is not replicated on PCB 305. Incoming first serial data wire 205 and second serial data wire 210 are joined together on PCB 305 for processing. Outgoing first serial data wire 205 and second serial data wire 210 are separated on board PCB 305 and then routed out to a downstream device (e.g., host 105 or another client $110_{x+1}$). Each PCB 305 is associated with, and part of, a battery module. Electronics on-board PCB 305 are powered by energy available from the associated battery module. Some interface elements that are part of PCB 305 are powered from host 105 as further described herein.

Processor 310 manages communications for client $110_x$. ASIC 315 includes an analog-digital converter (ADC) that measures voltages, temperatures, and other values for each battery module, and it turns on a bleed switch when commanded. It also contains secondary hardware overvoltage/undervoltage protection. This protection directly triggers a local fault indication/signal with no interaction with processor 310.

Processor 310 includes a universal asynchronous receiver/transmitter (UART) and is used to implement serial data communications with host 105 and clients $110_x$. UART is broadly adopted in commodity microcontrollers and does not require a separate clock signal which helps further maintain a reduced wire count and reduced costs.

Each client $110_x$ includes a set of isolators 320 that decouple information transfer between client-client transfers and client-host transfers without a common ground reference. PCB 305 includes four isolators 320, one for each of inbound serial data (both $205_{(in)}$ and $210_{(in)}$ are merged and coupled to a data-in signal trace 325 on PCB 305), outbound serial data (both $205_{(out)}$ and $210_{(out)}$ are merged and coupled to a data-out signal trace 330 on PCB 305), power wire 215, and fault wire 225. Some embodiments may reduce this wire count further, such as by modulating the data signal or the fault signal on top of the power on power wire 215. Some techniques such as, for example, data whitening, permit toggling of the serial data line at a constant enough rate to supply power to communications side 335 of isolators 320.

Isolators 320 as implemented are digital isolators that modulate a signal at a very high frequency (>100 MHz) to produce a high frequency AC signal. The digital isolator passes this AC signal over a capacitor or an inductor and achieves the desired isolated communication. Optical isolators are used in some embodiments when the design is not as sensitive to cost and power concerns.

Isolators 320 thus isolate a communications side 335 from a local side 340. Communications side 335 of every client $110_x$ are all referenced to the same ground using ground wire 220. Local side 340 is referenced to a ground of the associated battery module supporting PCB 305. Isolators 320 thus transfer information between two different voltage domains (a communications domain including other devices of battery electronics system 100 coupled to communications side 335) and a local domain including devices of PCB 305 coupled to local side 340). Isolators 320 have a characteristic of being tolerant of these domains moving (electrically) relative to each other. An amount of common-mode voltage slew that isolators 320 must withstand varies by application. In this case, isolators 320 are able to withstand ~20 kV/μS of common-mode slew before data transfer between the domains is at risk of corruption.

One way that isolators 320 achieve the desired voltage isolation is that they are built using multi-chip-module (MCM) manufacturing techniques which embed multiple semiconductor dies into one substrate and package. Physical differences between the multiple dies of isolator 320 promote the voltage isolation. ASIC 315 can be built using MCM manufacturing techniques. In some embodiments of the present invention, the semiconductor die or dies used for isolator 320 are embedded into the substrate and package of ASIC 315 to further reduce use of external components while achieving desired levels of noise immunity.

As noted above, the general transmission protocol is for host 105 to initiate all communications by sending commands over the unidirectional daisy-chained serial data loops. Further, each client $110_x$ re-transmits every received command as well as all data responses to those commands that have been transmitted from downstream clients $110_{y,\ y<x}$. Each client may also have a response of its own to transmit as well. Battery electronics system 100 requires a scheme to identify data packets as the UART does not have a built-in mechanism to frame a beginning and end of data packets.

Each client $110_x$ implements the UART to receive and transmit these commands and responses. The responses, just like the commands, are streams of response data that will periodically include a series of bytes that could be interpreted as a command. Battery electronics system 100 must implement an easy, low-resource structure and method to detect beginnings and ends of a packet.

A simple mechanism that may be used in the present context is to use a sustained period of complete silence as a mark for the beginning of a packet. Isolators 320 are designed to inhibit spurious bytes from being induced on a data wire due to electrical noise. Therefore when host 105 is not transmitting and all clients $110_x$ have re-transmitted all commands and responses, the data wire is dependably completely silent. The length of time that is required for a command to be circulated from host 105 through all clients $110_x$ is a reference period used for this period of silence. Host 105 easily frames commands by simply waiting for a previous command to complete before sending a subsequent command.

Figure 4:
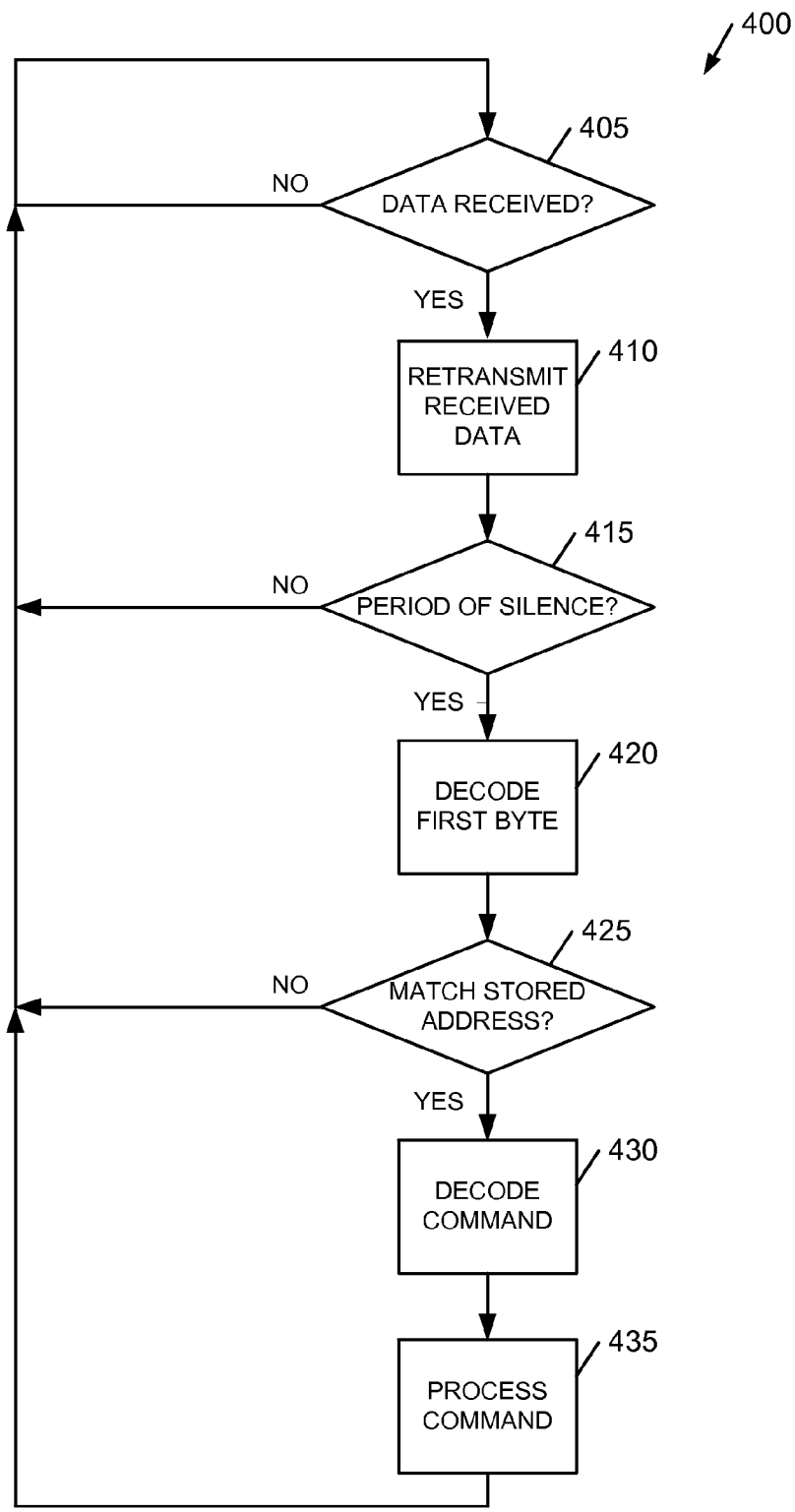
FIG. 4 illustrates a flowchart of a client response process 400 to received serial data.

Clients $110_x$ also use the period of silence. FIG. 4 illustrates a flowchart of a client response process 400 to received serial data. Process 400 includes steps 405-435. Process 400 begins with a test at step 405 to determine whether any data is being received. Without receiving data, process 400 loops and repeats the test at step 405 while assessing a length of time for which no data has been received. However, when the test at step 405 is true (and there is received data), process 400 advances to a step 410 to retransmit the received data. After step 410, process 400 performs a test at step 415 to determine whether the measured silence period for data receipt met the predetermined length of time threshold. When the test at step 415 is negative, process 400 returns to step 405 and waits for received data.

However when the test at step 415 is true, process 400 decodes the first byte at step 420. A subsequent test at step 425 determines whether the decoded first byte, which will be an address when the received data is a properly formed command, matches the stored address associated with the client. That is, does the first byte suggest that the received data is a command for this specific client. When the test at step 425 is negative, process 400 returns to step 405 to wait for received data. When the test at step 425 is true, process 400 decodes the next byte or two at step 430 to decode the command. Thereafter process 400 performs step 435 to process the command, which may require additional bytes of data and may result in the client adding a response to the received data. After step 435, process 400 returns to step 405 and waits for additional data.

There are other mechanisms that battery electronics system 100 could implement for packet framing, including byte stuffing to mark a specific byte as a start-of-frame delimiter and prevent that particular byte from appearing in real data. Byte stuffing would be advantageous in allowing commands to be pipelined on the communications bus and increase bus utilization. However doing so requires more processing by the processors of host 105 and clients 110$_x$.

In communications systems that have a host issuing commands to clients over a bus, it is common to introduce a signaling system so the host can determine whether the clients have properly detected and decoded the commands that have been issued. One mechanism to do this includes use of acknowledge/not acknowledge (ACK/NAK) responses that the clients provide after receiving a command. In the present context that includes a host sending broadcast messages for all clients, it becomes difficult to manage multiple clients all transmitting ACK/NAK at the same time.

Battery electronics system 100 implements a simple loopback error detection mechanism. The protocol that is used has each client re-transmit received commands and responses allowing the host to confirm that all clients have properly detected and decoded the commands. In response to a command, all the clients sequentially re-transmit that command until the final client re-transmits the command back to the host. Host 105 compares the received command to the command it transmitted. When there is a byte-by-byte match, host 105 concludes that every client 110$_x$ saw the command as it was sent. No ACK/NAK handshaking is used.

Battery electronics system 100 requires that each and every client 110$_x$ have a unique address so host 105 can unambiguously reference it with a command. Manufacturing an EV having multiple modules as part of an energy storage system is simplified when battery modules may be physically installed with as few requirements and constraints as possible. Therefore it is preferred that manufacturing not predetermine and set addresses as the modules are installed or that manufacturing not worry about module connection order. Therefore the host and clients determine the addresses at runtime. This can be a challenge as host 105 does not have any specific addresses to use when assigning addresses.

Battery electronics system 100 provides a solution that includes having each client 110$_x$ start with an address "0" when powered on. Battery electronics system 100 considers any client 110$_x$ with an address of "0" as being "unaddressed." The first byte (of 8 bits) of any packet is an address byte. Two bits of the address byte (e.g., the first and second bits) are reserved. One reserved bit is a read/write bit and the other reserved bit is an illegal address bit. The remaining bits provide for a maximum of 62 different useable addresses and thus 62 uniquely addressable clients 110$_x$. The following enumeration process (assigning non-illegal addresses to all clients 110$_x$) uses the general operational transmission rules with one exception. That exception not requiring, under a very special set of conditions, that client 110$_x$ exactly retransmit received data.

Figure 5:
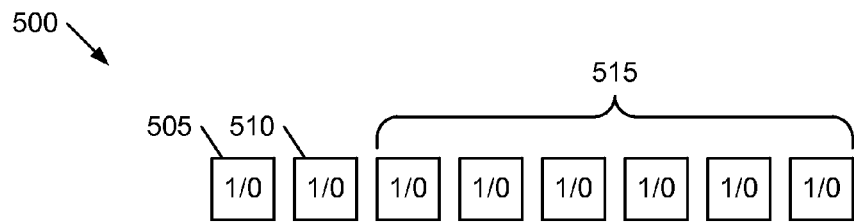
FIG. 5 illustrates an address byte used in the battery communications system.

FIG. 5 illustrates an address byte 500 used in battery electronics system 100. A first bit 505 is the reserved illegal address bit and a second bit 510 is the reserved read/write bit. Six low-order bits 515 are the address bits of address byte 500. The six bits (000000)-(111111) represent 63 different addresses, with the address (000000) reserved for enumeration leaving 62 operational addresses (000001)-(111111).

Figure 6:
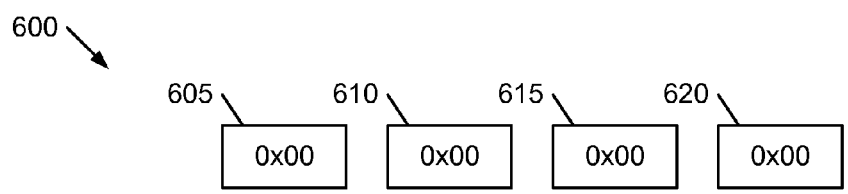
FIG. 6 illustrates a packet 6 having 4 bytes used in the battery communications system during enumeration.

FIG. 6 illustrates a packet 600 having 4 bytes used in battery electronics system 100 during enumeration. (Packets may have differing arrangements and numbers of bytes in other embodiments.) Packet 600 includes a first byte 605 that is an address byte (e.g., address byte 500 shown in FIG. 5), a register byte 610, a payload byte 615, and a CRC byte 620.

Figure 7:
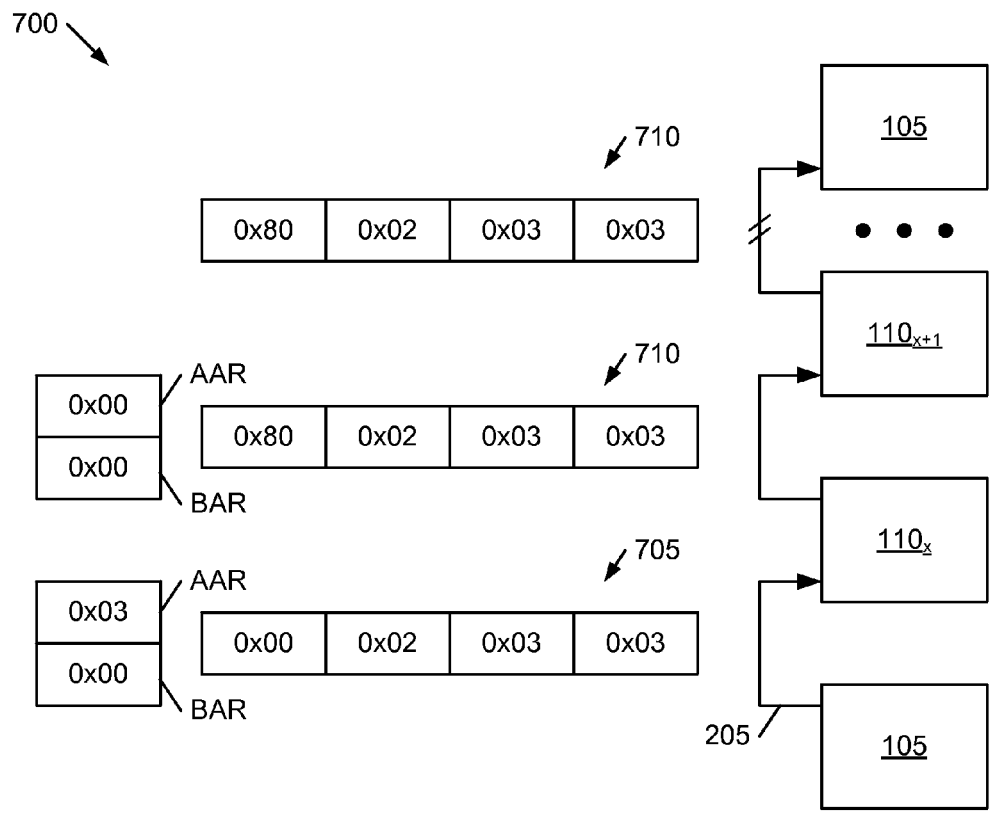
FIG. 7 illustrates a sequence of address enumeration transmissions initiated by the host 105.

FIG. 7 illustrates a sequence 700 of address enumeration transmissions initiated by host 105. Host 105 initially sends an enumeration packet 705, and it arrives at a client 110$_x$ over first serial data wire 205. Enumeration packet 705 includes an address of (000000) with the illegal address bit and read/write bits both set to (0). (This is represented in hexadecimal as (0x00).) Also illustrated in FIG. 7 are a "before" address register BAR and an "after address" register AAR. These show the value of an internal memory that each client 110$_x$ uses to determine its address.

In response to receipt of a packet (e.g., enumeration packet 705) from host 105, each client operates using process 400 of FIG. 4. A first client 110$_x$ that has an address matching (000000) decodes the remaining bytes which are used to set the desired unique address for client 110$_x$. In this case, host 105 is changing the address of client 110$_x$ from (000000) to (000011) which is also represented as 0x03. The BAR for client 110$_x$ is shown as 0x00 and the AAR is 0x03 reflecting this change.

Normally client 110$_x$ would retransmit the received packet to client 110$_{x+1}$, but doing so would result in client 110$_{x+1}$ also having an address of 0x03. To prevent this, in this special case client 110$_x$ retransmits a modified enumeration packet 710. Modified enumeration packet 710 is exactly like enumeration packet 705 except that the illegal address bit is set high. Thus address byte 500 is changed from (00000000) to (10000000) which is also shown as a change from 0x00 to 0x80. Client 110$_{x+1}$ will decode the address of modified enumeration packet 710 as (000000) which matches its address, but because the illegal address bit is set, client 110$_{x+1}$ ignores this packet transmission and does not change its address. Client 110$_{x+1}$ simply retransmits modified enumeration packet 710 exactly as it was received. BAR and AAR for client 110$_{x+1}$ are both shown as 0x00.

This enumeration process is repeated for each client 110$_x$, with addresses assigned in the order of their connection on the daisy-chain loop. Host 105 eventually receives a loopback in response to the transmitted enumeration packet 705. As long as host 105 receives modified enumeration packet 710 in response, host 105 confirms that a client 110$_x$ acted upon the enumeration packet 705.

Battery electronics system 100, configured in this way, operates with a latency that is a potential limitation for the number N clients 110$_N$. Every client 110$_x$ receives a full byte before transmission, therefore there is a minimum of one byte-time (time to transmit one byte at a chosen baud rate) of latency per client. For a read command that is three bytes, host 105 must wait N+3 byte-times before receiving a first byte of the response. Some applications may be limited by this latency as N increases.

Figure 8:
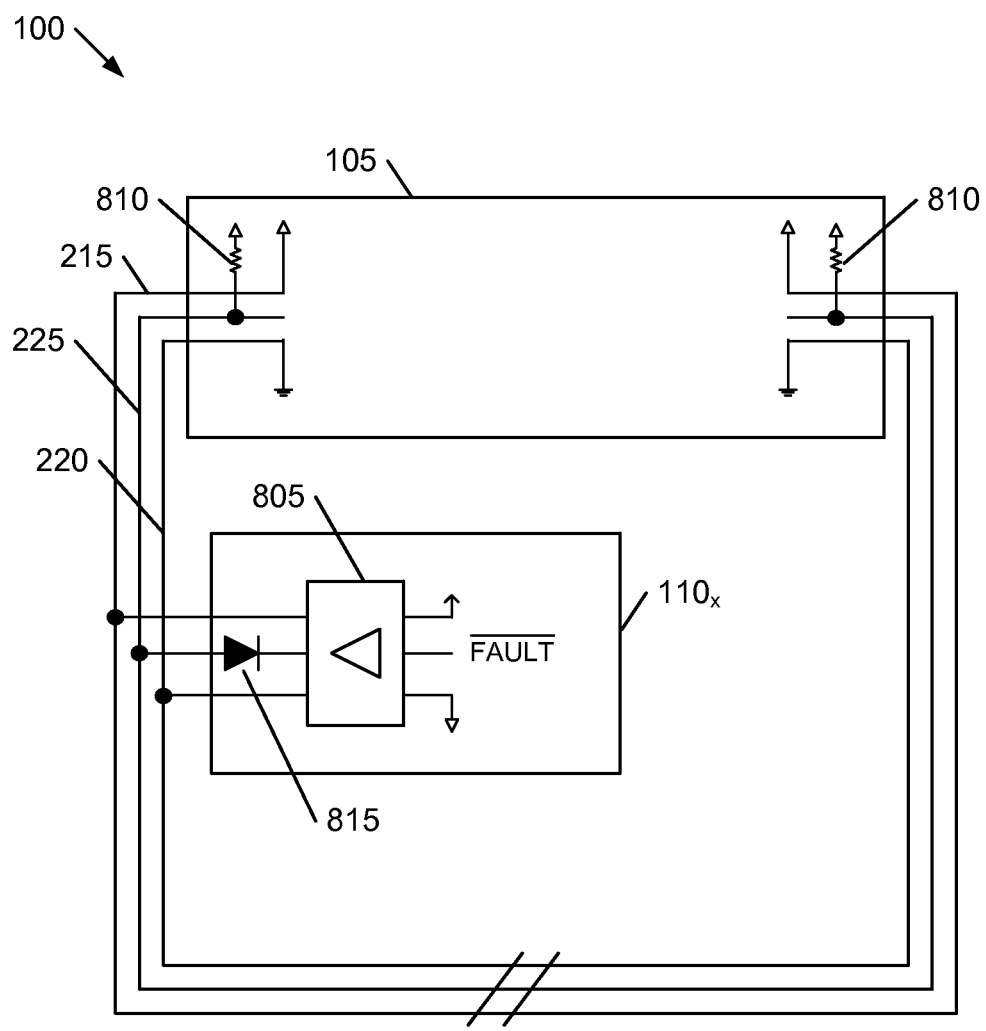
FIG. 8 illustrates a detailed general schematic of a signal transmission portion of a fault signaling subsystem for battery communications system.

FIG. 8 illustrates a detailed general schematic of a signal transmission portion of a fault signaling subsystem for battery electronics system 100. As noted above, battery electronics system 100 includes fault wire 225 to achieve high safety system reliability. Each battery module is provided with a mechanism, through its battery module board, to generate a fault signal. This fault signal provides a redundant hardware path with respect to data transmission to cause the EV to respond appropriately in the case of a detected fault of the energy storage system or one of its components. Fault wire 225 is a shared fault wire distributing the on-board fault signal to battery electronics system 100. Fault wire 225 uses the circular topology of the daisy-chain bus to provide a dual redundant fault path from each client 110$_x$ to host 105.

Each of the N clients 110 must be able to transmit its fault signal to host 105, and do so reliably. In this example any individual fault signal generated by any client 110$_x$ is a sufficient condition to alert host 105 of a fault state, therefore the signaling medium must allow for a "wired OR" summation of all the individual fault signals from all clients 110$_x$. To improve robustness in case of physical damage, the signaling medium provides two independent paths to host 105 from each client $110_x$.

In actual implementation, fault wire 225 is installed in a connector and that connector is used to physically attach to the battery module board hosting a client 110. Wires are joined to the connector using a crimp terminal. It is sometimes the case that desired levels of reliability and costs are not achieved by using a single crimp terminal to join two or more conductors/wires. To improve reliability and reduce costs, there is a limitation that no more than a single conductor/wire is associated with any crimp terminal which means that each connector circuit cannot be associated with more than one signal conductor.

To meet all these requirements and connect multiple fault signals to a fault wire 225, battery electronics system 100 uses "open collector" signaling for a fault signal transmitter 805 (shown as a transmitter channel in isolator 320). With open collector signaling, each fault signal transmitter 805 is capable of sinking current from a signal conductor (e.g., fault wire 225) to ground, but is incapable of sourcing current into the signal conductor. In an IDLE state (no fault signals are active), fault wire 225 is maintained at a positive power supply potential, such as by using one or more pull-up resistors 810.

For example, these resistors 810 would be chosen to have a value such that the current flowing through them when a potential equal to the daisy-chain supply voltage is applied to them is close to but less than the minimum guaranteed output current of fault signal transmitters 805. This allows fault signal transmitters 805 to reliably drive fault wire 225 but provides as much margin for noise current rejection as possible: the larger the current necessary to cause a given voltage drop across resistors 810, the smaller the voltage induced by a given noise current. For battery electronics system 100, the parallel combination of the pull-up resistors is 2.375 kOhms, which causes approximately 2 mA of current to flow when the supply voltage potential of 5V is applied across resistor 810. The maximum rated output current of fault signal transmitters 805 is 4 mA, leaving enough margin to ensure that fault signal transmitters 805 reach their intended output voltage under all conditions.

Care must be taken in order to guarantee proper digital signaling margins under all conditions so as to not generate false fault indications while being responsive to any actual fault signal to reliably signal the fault state using fault wire 225. For example, fault signal transmitter 805 may not be an open collector transmitter. One way to convert it for open collector operation is to use a diode 815 in series with an output of fault signal transmitter 805. Having a cathode of diode 815 coupled to this output and an anode coupled to fault wire 225, low voltage on the output of fault signal transmitter 805 tends to pull fault wire 225 towards ground, signaling a fault to host 105. A sum of a maximum diode forward voltage at the worst case pull-up resistor current plus the maximum guaranteed output voltage of fault signal transmitter 805 at the same current is less than a maximum input low voltage of receivers at host 105 which are intended to receive the fault signal.

Figure 9:
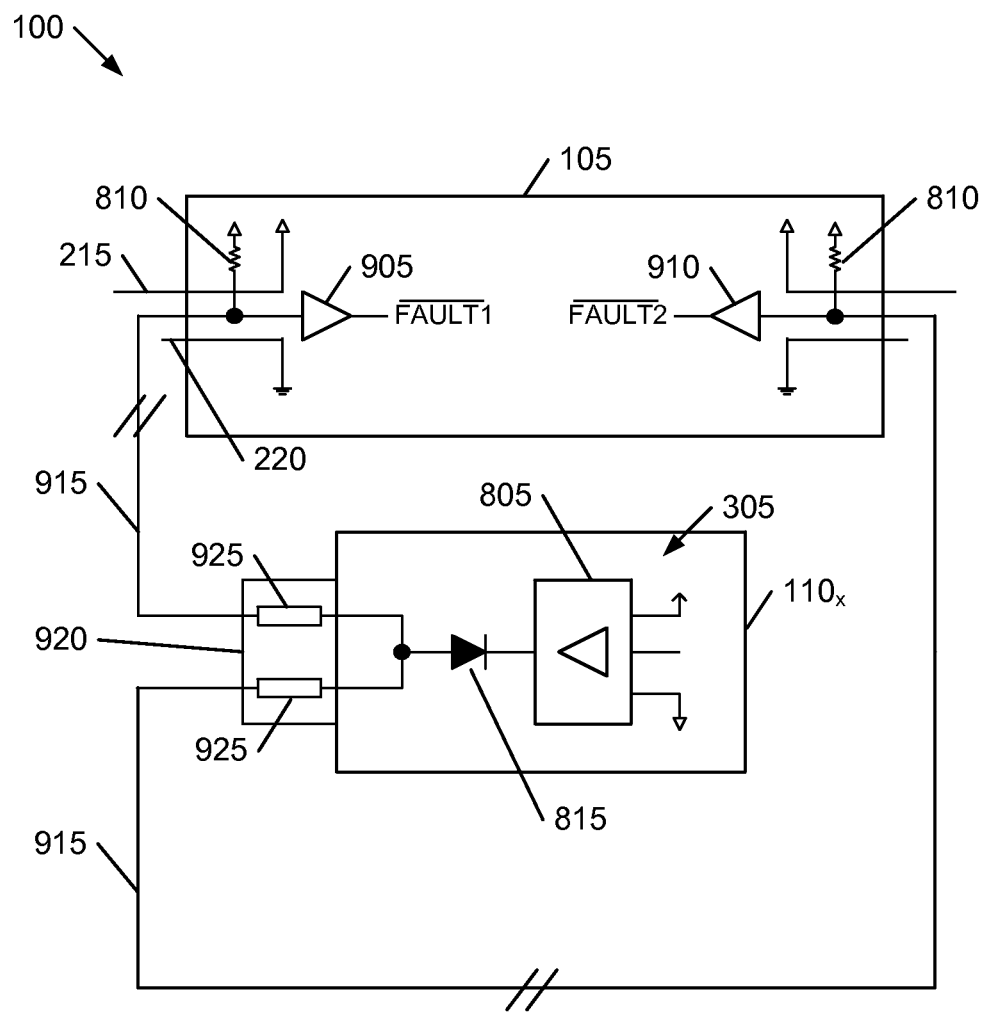
FIG. 9 illustrates a detailed general schematic of a redundancy portion of a fault signaling subsystem for battery communications system.

FIG. 9 illustrates a detailed general schematic of a redundancy portion of a fault signaling subsystem for battery electronics system 100. Conceptually fault wire 225 achieves redundancy using a circular topology, following the topology of a daisy-chain loop from the host to all the clients and back to the host. The daisy-chain loop begins and ends at host 105 with fault wire 225 doing the same. Host 105 includes a first fault receiver 905 and a second fault receiver 910 for receiving the fault signal. A break at any one point in fault wire 225 creates two portions and interrupts only one of the signal paths, a second signal path to one of the fault receivers of host 105 always exists. Each fault receiver is provided with pull-up resistor 810 to ensure that each portion of fault wire 225 assumes the correct IDLE potential when none of the connected fault signal transmitters 805 are active. When there is no break, the pair of pull-up resistors 810 exist in parallel on fault wire 225 and are accounted for during operation.

The design constraint described herein concerning mechanical joins using crimp terminals means that a single wire cannot be literally extended in a complete circuit and make the necessary connections. Thus, fault wire 225 is perhaps more properly described as a fault path and is created using numerous single wire segments 915. Each PCB 305 supporting client $110_x$ includes a daisy-chain connector 920 and the wire segments 915 span that part of the daisy-chain which runs between adjacent daisy-chain connectors 920. Each daisy-chain connector 920 includes a pair of crimp terminals 925, each joins to an end of a wire segment 915. For client $110_x$, one crimp terminal joins to wire segment 915 extending to client $110_{x-1}$ and one crimp terminal joins to wire segment 915 extending to client $110_{x+1}$. These segments are each joined together using metal traces of PCB 305 coupled to daisy-chain connector 920. Without this built-in redundancy, the mechanical connector design constraints could be problematic as a fault signal originating at any client $110_x$ must enter and exit all intermediate clients $110_x$ to get to host 105. Given that mechanical connectors are a common point of failure for electrical systems, the use of multiple wire segments 915 could subject the fault signal to multiple mechanical connections in series. The implemented redundancy reduces the attendant risks in this implementation.

The aforementioned redundancy does not protect against progressive degradation of the mechanical connections in the battery pack which may lead to multipoint failure of the harness, so host 105 must have a mechanism for detecting a single point failure of the fault signaling path and responding appropriately (e.g., preventing continued operation of the vehicle) if the fault signaling redundancy is broken. Since host 105 includes two separate fault receivers (receiver 905 and receiver 910), each of which should be able to detect a fault signal from any of the clients $110_x$, host 105 may execute a self-test sequence to verify the signaling redundancy. Since the clients $110_x$ may be commanded to activate the fault signal manually via the daisy-chain data signals, host 105 can activate each fault signal of each client $110_x$ in turn and verify that both of the fault receivers detect the fault signal. Only one client $110_x$ need be activated to ensure the integrity of the redundant fault signaling wire all the way around its circular path, but activating each of the clients $110_x$ will further test each of the fault signal transmitters 805, and guarantee that the fault signaling path is intact from each fault signal transmitter 805 to both receiver 905 and receiver 910.

All the signal paths (i.e., serial data, power, and fault) are routed through an environment having large changes in current in very short periods of time as is common for a high voltage battery. Such an environment requires care when that route includes a circular signal path as is implemented in battery electronics system 100. The rapid current changes with respect to time create changing magnetic fields that induce electromotive forces (EMFs) in any conductor that encloses a finite area. The EMF, without proper care, can cause undesired current to flow in signal conductors or disrupt signals which are encoded as voltages. A conventional solution for EMF environments provides for use of differential signals for communication as they are unaffected by induced EMF.

Figure 10:
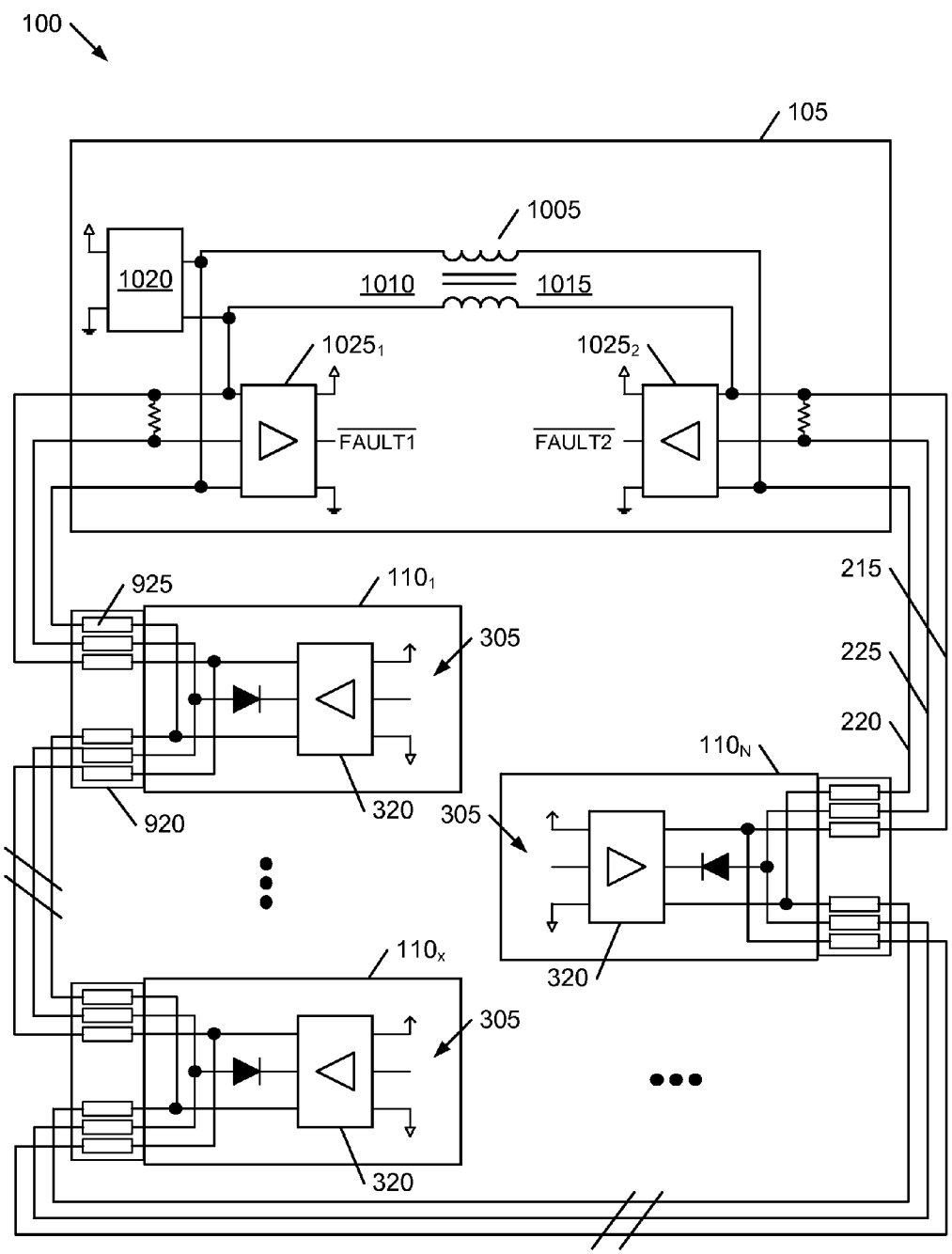
FIG. 10 illustrates a detailed general schematic of an interference rejection portion of a fault signaling subsystem for a battery communications system.

FIG. 10 illustrates a detailed general schematic of an interference rejection portion of a fault signaling subsystem for battery electronics system 100. Signaling in battery electronics system 100 does not use true differential signaling as that term is commonly understood. Fault in battery electronics system 100 is transmitted reliably using a single circularly routed conductor in spite of induced EMF by making the fault signal differential with respect to the power and ground conductors. Isolated power wire 215 and isolated ground wire 220 follow the same path through the battery environment as fault wire 225. This means that these signal paths experience the same added EMF as fault wire 225.

Battery electronics system 100 includes a daisy-chain isolator 1005 that defines and decouples a first end 1010 of the daisy-chain loop from a second end 1015 of the daisy-chain loop. Daisy-chain isolator 1005 is a high frequency isolator (e.g., a pair of inductors, chokes, or the like) that allows induced EMFs to create a potential difference between first end 1010 and second end 1015. That potential difference does not cause disruptive current to flow in the daisy-chain loop because of the high-frequency isolation.

This potential difference without due consideration could be disruptive of digital signaling. In battery electronics system 100, digital transmitters and digital receivers used at first end 1010 and second end 1015 are referenced to only power and ground potentials present at their respective ends, both ends powered by an isolated power source (e.g., an isolated DC-DC converter 1020) as further described below. Further, the digital transmitters and receivers have no connection to the other end of the daisy-chain loop. For example, a digital receiver $1025_1$ for first end 1010 is electrically separated from a digital receiver $1025_2$ for second end 1015. The signaling circuits of battery electronics system 100 all include a signal wire (e.g., fault wire 225) and a reference potential derived for a reference circuit. In this context, a reference circuit means those power and ground circuits supplying the relevant transmitter and receiver. Such signaling circuits of battery electronics system 100 do not experience any disruptive potential from the EMFs present because the induced EMFs cause any potential to be added equally to a potential of the signal wire and a potential of the reference circuit.

In battery electronics system 100, each end of the daisy-chain loop is connected to the remainder of the host 105 circuitry by a separate digital isolator, whose receivers and transmitters are allowed to assume the same reference potential as their respective ends of the daisy-chain, and which serve to translate the received and transmitted signals of the daisy-chain loop to and from the common reference potential of the remainder of host 105 circuitry. The daisy-chain ends of these digital isolators are powered by the daisy-chain power and ground signals, and the other ends are powered by the common host power and ground signals used by the remainder of the host circuitry.

Figure 11:
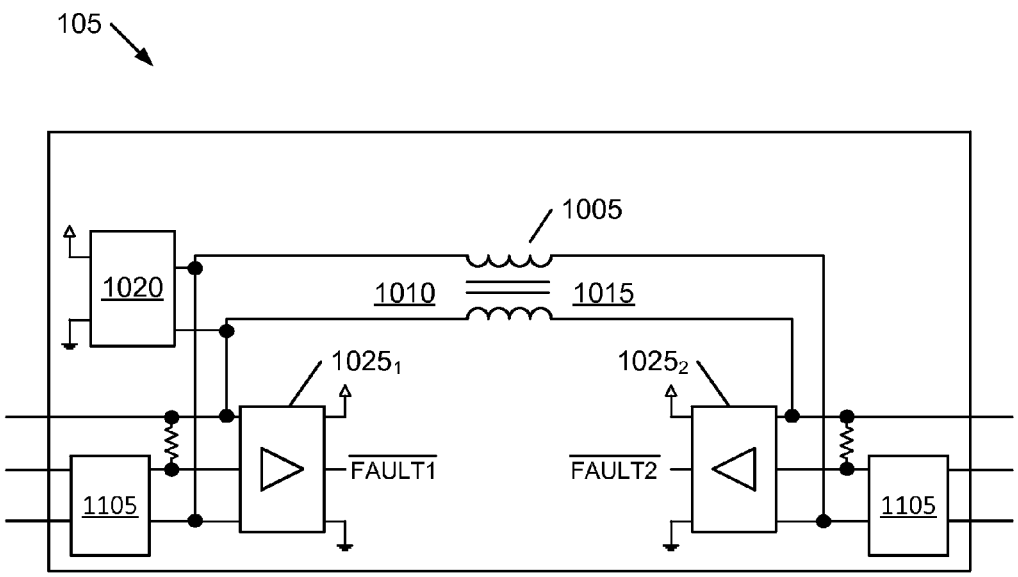
FIG. 11 illustrates an alternate configuration for the host from that shown in FIG. 10 which adds a filter at each end of the daisy-chain loop.

FIG. 11 illustrates an alternate configuration for host 105 from that shown in FIG. 10 which adds a filter 1105 at each end of the daisy-chain loop. In FIG. 10, under some conditions it is possible for spurious potentials to appear on fault wire 225 with respect to the reference circuit. Such spurious potentials can be attributed to many different causes but is possibly some type of capacitive coupling. Filter 1105 helps to reject such spurious potentials and is preferably implemented as some type of low pass filter. Some implementations may find that a simple RC low pass filter is sufficient, while for other implementations, a different filter may be necessary or desirable. Other filter types for filter 1105 may include some form of Pi filter to help address any high frequency signals appearing on fault wire 225 via capacitive coupling.

FIG. 10 also illustrates power distribution for battery electronics system 100. The disclosed daisy-chain bus uses active digital circuitry at each client $110_x$ for voltage isolation. PCB 305 of each client $110_x$ of the disclosed embodiment includes isolators 320 that are implemented as a packaged digital isolator semiconductor device solution (e.g., "chips" or integrated devices and the like). Battery electronics system 100 must distribute power to each client $110_x$ in order to operate isolators 320. Battery electronics system 100 implements a simple 5V DC distribution bus.

The daisy-chain bus uses galvanic isolation between the data transmission medium and nodes originating the data (i.e., host 105 and clients $110_x$) therefore a mechanism must be provided to power the "floating" portions of each isolator 320. In FIG. 3, isolator 320 includes a communications portion 335 (this is the floating portion) and a local portion 340. The local portion is powered by local power sources available to each battery module or host. Communications portion 335 needs to be powered by a "floating" power source. A convenient form for such a power source is isolated DC-DC converter 1020. As shown, one isolated DC-DC converter 1020 is used to power all nodes which requires that conductors be used to distribute the requisite power to all nodes. An alternative would be to install a DC-DC converter at each node and power each node separately.

Using the single isolated DC-DC converter 1020 requires installation and routing of power wire 215 and ground wire 220 in a daisy-chain loop to each node. These wires are subject to the same mechanical design constraints, and potential EMI issues as described herein in the context of installation and routing of fault wire 225. Similarly to the distribution of fault wire 225, each wire is actually implemented as a single path rather than a single conductor. There is a power path and a ground path, each path made up of spanning wire segments joined to daisy-chain connectors 920 using crimp terminals 925. Conductive traces on PCB 305 split and route power and ground to each isolator 320.

The daisy-chain topology for the power and ground paths provides redundancy and EMI robustness similarly to the discussion of the fault path of the daisy-chain loop. A single break does not disable power and ground connections for the nodes. Daisy-chain isolator 1005 alleviates any concerns regarding EMF-induced current flow.

However, in certain circumstances, adding daisy-chain isolator 1005 can result in unwanted behavior. Specifically, the daisy-chain bus as a whole and the power conductors in particular can act as a single-ended transmission line with respect to the surrounding metallic elements of the battery and battery enclosure. Terminating first end 1010 and second end 1015 of this transmission line into a high impedance element such as an daisy-chain isolator 1005 changes the modal structure of the transmission line, and opens up a lowest-order standing wave resonant mode at half of the frequency of that experienced by a transmission line whose ends are terminated to each other. Specifically, the lowest order standing wave mode that can exist on a circular transmission line consists of a sine wave of current (or potential) which exhibits one complete period of spatial oscillation around the complete circuit of the transmission line: this wave will have a temporal frequency equal to the single ended frequency-dependent propagation velocity of the transmission line at the frequency of resonance divided by the length of the line. A linear unterminated transmission line, on the other hand, can experience a standing wave mode where current (or potential) exhibits a half-period of spatial oscillation over the length of the line. This mode has a temporal frequency equal to the frequency dependent propagation velocity of the single-ended mode of the line at the resonant frequency divided by twice the length of the line.

If the mutual inductance of the data transmission conductors of the daisy-chain bus with respect to the power conductors considered as a whole were equal to the self-inductance of the power conductors, then the potential gradients experienced by the power conductors during undriven oscillations of the daisy-chain terminated with high impedance in the above described mode would be matched by identical potential gradients along the data conductors, and no interfering potentials would be introduced into the data signaling circuit. Unfortunately, since this is not the case, the data conductors will experience smaller potential gradients, and those data signaling circuits closest to the current maximum of the resonance (the potential gradient maximum, which occurs in the middle of the linear transmission line's lowest mode) will experience induced potentials at the rate of the modal oscillation. These potentials, if large enough, could disrupt digital signaling. Since the lower frequency rate of oscillation of the linear transmission line's 1st order mode will be closer to the signal frequency and hence harder to reject via filtering than the 1st order mode of the circular transmission line's resonance, it may be necessary to add damping to the above described resonant mode of the daisy-chain if inductors are added to reduce EMF-induced current flow. This can be accomplished by inserting resistors in parallel with the inductors or chokes, connecting one end of the daisy-chain to the other and hence bleeding energy from the 1st (and all other odd order) resonant mode(s) when the potential difference is at its maximum. This damping effect could also be had by adding distributed or bulk series resistance at other points along the power conductors of the daisy-chain: but since the object of the power conductors is to distribute DC power across a distance, added series resistance would interfere with their function. In practice, the signaling rate of battery electronics system 100 is low enough that added damping is not necessary, since the lowpass filters that battery electronics system 100 insert between each daisy-chain data conductor and its associated data receiver are sufficient to reject the oscillatory potentials associated with the resonance mode described above. However, for longer daisy-chains or systems requiring higher signaling rates, such damping may prove advantageous.

Figure 12:
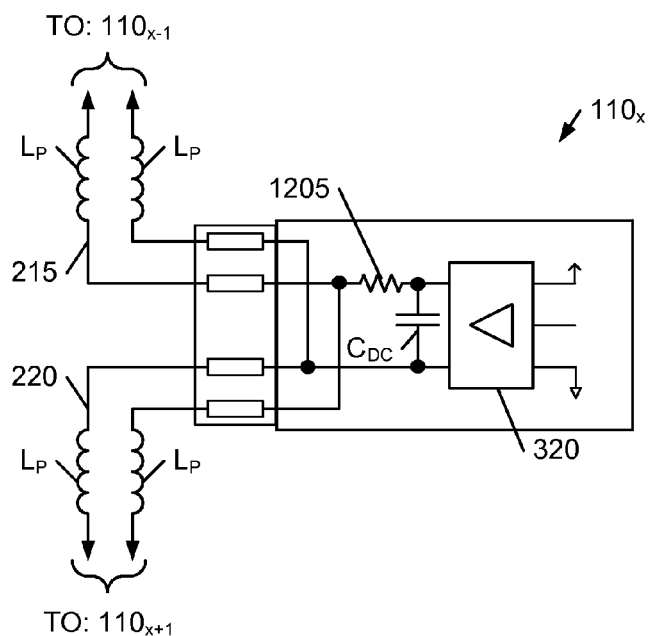
FIG. 12 illustrates a detailed schematic diagram of an oscillation damping portion of the power distribution implementation for client.

FIG. 12 illustrates a detailed schematic diagram of an oscillation damping portion of the power distribution implementation for client $110_x$. This oscillation damping mechanism addresses a different type of parasitic oscillation which may arise in a power bus, namely differential oscillation of the two power conductors with respect to each other. In some cases, a distributed reactance in the transmission lines (e.g., power wire 215 and ground wire 220, here modeled as $L_p$) may transmit differential voltage oscillations between power wire 215 and ground wire 220. Such oscillations involve current flowing between many decoupling capacitors (represented as $C_{DC}$) associated with isolators 320. A damping resistance ($R_D$) 1205 is added in series between each digital isolator 320 and power wire 215. Damping resistance 1205 dampens the oscillatory current associated with any parasitic transmission lines. An added benefit of damping resistance 1205 is that it prevents brief induced transients from reaching isolators 320 which protects them from potential sources of damage.

Figure 13:
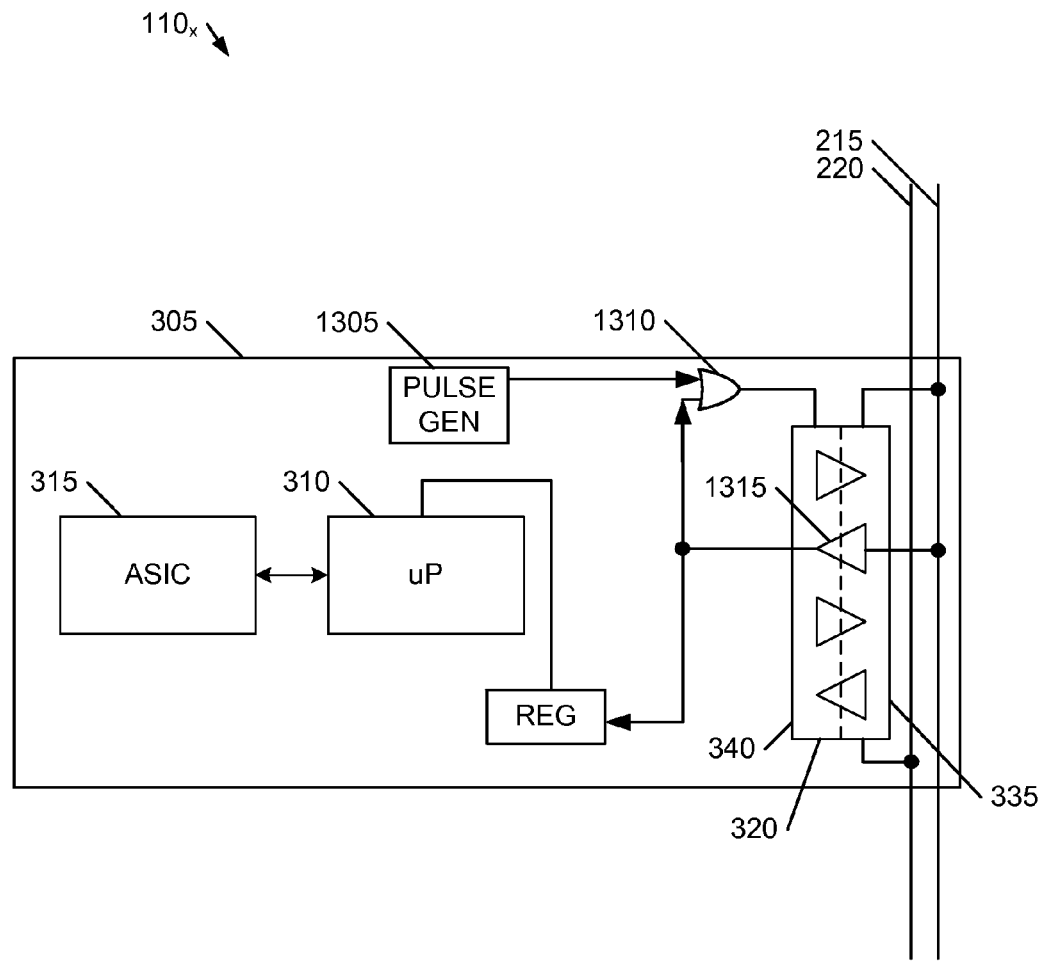
FIG. 13 illustrates a detail schematic diagram of a wake portion of the client.

FIG. 13 illustrates a detail schematic diagram of a wake portion of client $110_x$. As discussed herein, isolator 320 addresses electrical noise and communication between potential deltas in battery electronics system 100. Isolator 320 has a drawback in the present application in that it, when active, consumes power even when no data is actively being transmitted. To reduce power consumption, and improve battery standby life, local side of client $110_x$ switches "OFF" the power it provides to isolator 320 when no data is being transacted. Consequently host 105 must have a mechanism to command client $110_x$ to restore local power when communications are desired. That mechanism for determining a status of a host-provided power request signal is referred to herein as "WAKE." Client $110_x$ periodically restores power so dedicated logic circuitry on the client can poll the power request signal to determine whether host 105 desires to initiate communications. Local power is restored for short intervals. This ON/OFF cycle for isolator 320 is chosen to reduce an average power consumption to as low as possible without sacrificing required performance.

Client $110_x$ includes a pulse generator 1305 that provides a polling signal. When communication with host 105 is not active, the polling signal determines a status of local power to isolator 320. Periodically pulse generator 1305 asserts the polling signal (e.g., signal is turned "ON"). When asserted, the polling signal restores power to local side 340 of isolator 320, enabling all transmitters and receivers. When not asserted (e.g., signal is turned "OFF"), local power is interrupted which disables all transmitters and receivers.

A two-input logic-OR device 1310 (e.g., an "OR" gate) has a first input coupled to the polling signal of pulse generator 1305 and an output coupled to the power-enabling input of isolator 320. When the output of device 1310 is asserted, isolator 320 is enabled and when the output of device 1310 is not asserted, isolator 320 is disabled. Whenever the polling signal from pulse generator 1305 is asserted, the output of device 1310 is asserted.

Isolator 320 includes a wake receiver channel 1315 that is coupled to a WAKE signal from host 105. (In the preferred embodiment, power wire 215 is coupled to an input of wake receiver channel 1315 with the signal level of power wire 215 serving as the WAKE signal.) An output of wake receiver channel 1315 is provided to a second input of device 1310. Whenever the output of wake receiver channel 1315 is asserted, the output of device 1310 is asserted. Two conditions must be true for the output of wake receiver channel 1315 to be asserted: 1) the WAKE signal must be asserted by host 105, and 2) wake receiver channel 1315 must be enabled. When wake receiver channel 1315 is disabled, the only way to assert the output of device 1310 is for the polling signal to be asserted. When wake receiver channel 1315 is enabled, assertion of either the polling signal or assertion of the WAKE signal from host 105 enables wake receiver channel 1315. Enabling wake receiver channel 1315 enables all channels of isolator 320, and once enabled, host 105 maintains power to isolator 320 for as long as it asserts the WAKE signal. Deassertion of the WAKE signal returns control of the status of power for isolators 320 to individual clients $110_x$ which maintain isolators 320 active for brief periods to maintain power consumption at a minimum while periodically powering up isolator 320 to check on the status of the WAKE signal. By knowing the maximum OFF period of the polling signal, host 105 need only maintain the WAKE signal active for this duration to ensure that all isolators 320 in battery electronics system 100 are enabled and ready to transmit and receive data.

Fault cannot operate at all if the WAKE signal is not asserted by host 105. The reason that this is acceptable it that host 105, in this application, has only one response measure that it can take when the fault signal is asserted: (e.g., it can open the HV switches and disconnect the HV battery chain from the outside environment). The programming of the hardware and software of host 105 guarantees that it cannot close these HV switches in the first place unless it can communicate with the battery modules, and it can't do that unless the WAKE signal has been successfully asserted. So in short, when the WAKE signal is de-asserted, battery host 105 has no access to the fault signals of the individual modules: but the host has then already placed the battery in the safest state that it can attain, so the presence of that fault signal would not allow the battery to exhibit any useful safety behavior that it does not already exhibit. As an alternate implementation, the fault signal could be combined with the polling signal to turn on the local-side of isolator 320 whenever fault is asserted. This would lower the latency of host 105 receiving the fault signal when it turns on daisy-chain power. However, it would increase power consumption of the module in a fault state. Since undervoltage is one potential fault state, this could lead to quicker overdischarge of battery modules. Furthermore, the fault state would still not be present at host 105 until the host turns on daisy-chain power, applying power to the communication-side of the isolators.

The WAKE signal from host 105 may be more generally used to control other circuitry of client $110_x$. For example, a regulator 1320 is coupled to the output of wake receiver channel 1315. When regulator 1320 has a particular state (for instance, when an Enable input contained by that regulator and connected to wake receiver channel 1315 is driven to a logically true state), processor 310 is powered on, and when regulator 1320 does not have the particular state, processor 310 is powered off. In this way, the wake signal has complete control over the power state of processor 310. Host 105 can immediately power down processor 310 by de-asserting the WAKE signal. Power to processor 310 is restored whenever isolator 320 is enabled and the WAKE signal is asserted. In some embodiments, wake functionality is integrated into other components, such as for example, into isolator 320.

Battery electronics system 100 includes features for increased reliability in the high energy switching environment of an EV. One of those features is strategic and effective redundancy of signal and power connections. Detection of failure of a redundant path is desirable. Battery electronics system 100 performs wire break detection on the FAULT signal only by self-testing fault wire 225 at vehicle startup. Some embodiments will implement continuous monitoring of some or all broken wire failures.

Adding a redundant signal or power conduction path can increase the reliability of a system. In a naïve analysis, replacing a connection with a failure rate of Ti with a parallel combination of two identical connections with the same failure rate will result in a total failure rate of $\eta^2$. However, this analysis is based on the assumption of zero correlation between failure events, and Poissonian occurrence. In reality, failure events are not uncorrelated, and often arise from common causes at certain points in time. Such causes might include increased humidity, condensation, coolant leaks, sealing failure, periods of excessive vibration, clustered manufacturing process failures, and the like. Many of these failure causes could lead to both halves of a dual redundant system failing within a short time interval of each other, leading to a combined failure rate much closer to $\eta$ than to $\eta^2$. However, it is still likely that the failure events will not occur at exactly the same time. By detecting failure of the redundancy before both paths have succumbed to the failure, battery electronics system 100 is able to prevent further operation of the vehicle or signal to the driver that a repair is necessary before a dangerous spontaneous loss of function event can occur. Since battery electronics system 100 relies on dual conduction paths for a signal or power current in order to achieve redundancy, implemented methods of wire break detection (which here includes failure of mechanical connector terminals as well) rely on a pre-existent or additional auxiliary test current flowing through the circuit to be monitored to detect increases in the circuit resistance, caused by broken or degraded conduction paths. These increases manifest as a voltage change, which can be easily detected. The circuit topologies used by battery electronics system 100 feature low component count and implementation cost.

There are three types of conductors that battery electronics system 100 monitors for redundancy failure: a) data signals (e.g., first serial data wire 205), b) FAULT signal conductor (i.e., fault wire 225), and c) power conductors (e.g., POWER wire 215).

The basic dual-redundant data signaling path consists of two electrically parallel wires running from a transmitter to a receiver. Because these signals contain information over a moderately large range of frequencies (data is transmitted at ~1 Mbps), they need to present a relatively controlled impedance to the transmitter and receiver circuits for proper operation. Even though each data signal path itself is a single wire, battery electronics system 100 forms a differential data signal path by reference to a parallel power conductor. The differential data signal paths formed by each data conductor and its associated power conductor should be minimally linked by any changing magnetic fields present in the battery, to avoid introduction of spurious potentials into the signaling path.

Figure 14:
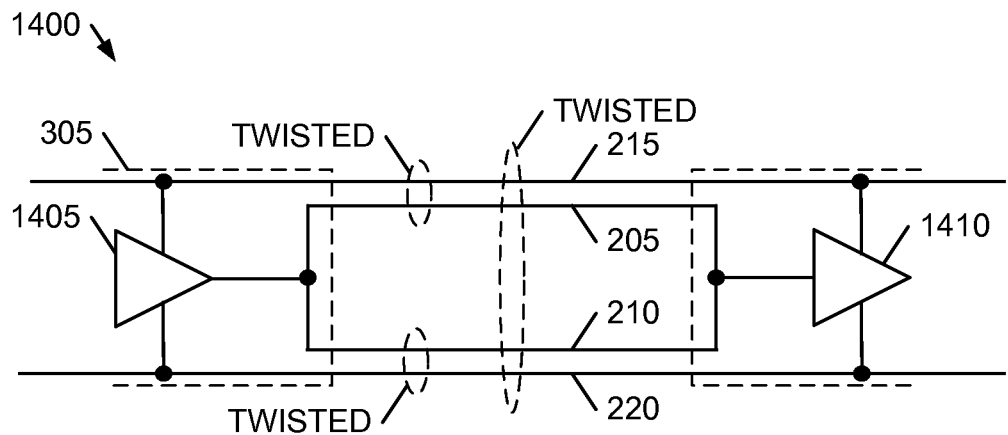
FIG. 14 illustrates a general schematic diagram of a portion of a differential data signal implementation of battery electronics system.

FIG. 14 illustrates a general schematic diagram of a portion of a differential data signal implementation 1400 of battery electronics system 100. Differential data signal implementation 1400 includes a data signal transmitter 1405 generating a data signal that is divided on PCB 305 into a pair of redundant data lines (first serial data wire 205 and second serial data wire 210). These signals, with power wire 215 and ground wire 220 are configured into differential data signal implementation 1440 where the data is transmitted to a receiver 1410 on downstream device.

De-linking the differential data signal paths is accomplished by twisting one of the signal conductors (e.g., first serial data wire 205) with positive power wire 215, and twisting the other signaling conductor (second serial data wire 210) with negative power wire 220. Additionally, it is desirable to reduce the amount of magnetic flux linked with the loop formed by the two data conductors or the two power conductors, and so it may be desirable to twist the two twisted pairs with respect to each other.

Figure 15:
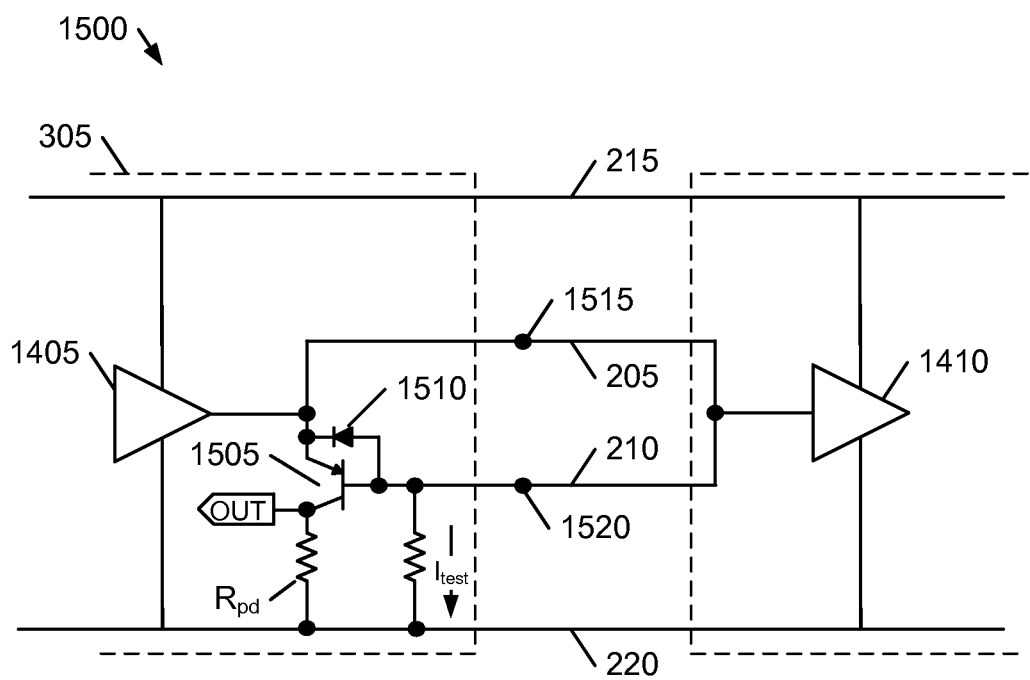
FIG. 15 illustrates a schematic diagram for a data conductor break detection circuit topology that includes a mechanism for data signal break detection (i.e., a "break detector")

FIG. 14 does not include any break detection circuitry. FIG. 15 illustrates a schematic diagram for a data conductor break detection circuit topology 1500 that includes a mechanism for data signal break detection (i.e., a "break detector"). To achieve break detection, battery electronics system 100 uses the fact that the implemented data transmission protocol guarantees a certain minimum duty cycle of the transmitted digital signal. The UART protocol includes a STOP bit for each transmitted byte, which means that there is at least some positive voltage present on the data bus every byte interval. This means that the detection circuit does not need to work with the bus in both states: it can be designed to work with the bus in the IDLE (STOP bit) state only. Also, because the STOP and IDLE states are the same, the data bus is guaranteed to spend most of its time in this STOP state, increasing the chances that the break detection circuitry will detect any connection failure, including transient failures.

The break detector of data conductor break detection circuit topology 1500 is based on the base-emitter junction of a single BJT transistor 1505, with a PN diode 1510 connected to the base-emitter junction in anti-parallel to allow signal currents of both polarities to pass through the break detector. Transistor 1505 exhibits predictable $V_{BE}$ values for a given temperature range and test current, and likewise diode 1510 exhibits predictable forward voltage ($V_f$) values for the same temperature range and current. Battery electronics system 100 guarantees that small voltage drops caused by a test current ($I_{test}$) through a good conductor will not cause false failure signals by sizing test current $I_{test}$ such that the voltage drop incurred by expected resistances is much less than the minimum expected $V_{BE}$. Moreover, because the maximum $V_{BE}$ and maximum $V_f$ are small compared to digital signaling voltages, the voltage lost across the base-emitter junction should it carry the signaling current is small.

The following discussion relates to transmitter 1405 generating a high voltage, which is guaranteed to occur at least some of the time as explained above. Under normal conditions (no breaks in either data signaling conductor (i.e., first serial data wire 205 or second serial data wire 210)), a circuit formed by the two signaling conductors keeps the base-emitter voltage of the transistor 1505 equal to zero. In the event that the signaling circuit is broken at either a first position 1515 in first serial data wire 205 or a second position 1520 in second serial data wire 210, the current $I_{test}$, which normally flows from an output of transmitter 1405 through the signaling circuit to ground, will be re-routed so that it flows through the base-emitter junction of transistor 1505. As long as the DC current gain of transistor 1505 is sufficiently high, this base-emitter current causes transistor 1505 to conduct. The conduction current produces a voltage across a pull-down resistor $R_{pd}$ that is available at an output node (OUT). Normally resistor $R_{pd}$ is chosen to have a large enough value that the voltage across it will rise until transistor 1505 enters saturation, at which point the voltage at the OUT node equals a transmitter output voltage minus a saturation voltage of transistor 1505. The presence of voltage at the OUT node is an indication that the signaling circuit has failed, and that redundancy is lost. OUT may be routed to a digital input of a microcontroller or other integrated circuit, where it may be monitored. Alternatively OUT may be connected to the fault signaling line in a three-level signaling scheme, discussed herein. Host 105 is able to monitor all data signaling wire paths at a central location by monitoring the voltage on FAULT wire 225.

It should be noted that the details of the implementation of FIG. 15 are general in nature with exact implementation details depending on the application requirements. For instance, although the DC voltage drop across the intact signaling conductors in this topology will never be enough to trigger conduction of the B-E junction, transient AC voltages may develop across the signaling conductors when transmitter 1405 changes its digital output state. Specifically, an inductance in the circuit formed by the two data conductors on longer cable runs can allow this voltage to develop. In order to address this issue, a capacitor may be installed in parallel with the B-E junction. This will provide a conduction path for AC transients, while still allowing the DC component of $t_{test}$ to activate transistor 1505 in the event a signaling path interruption occurs. Care should be taken that any resonant circuit formed by such a capacitor and the inductance of the circuit comprising the two data conductors is not under-damped: this could cause activation of transistor 1505. Insertion of a resistance in series with the redundant signaling line could solve the problem.

Figure 16:
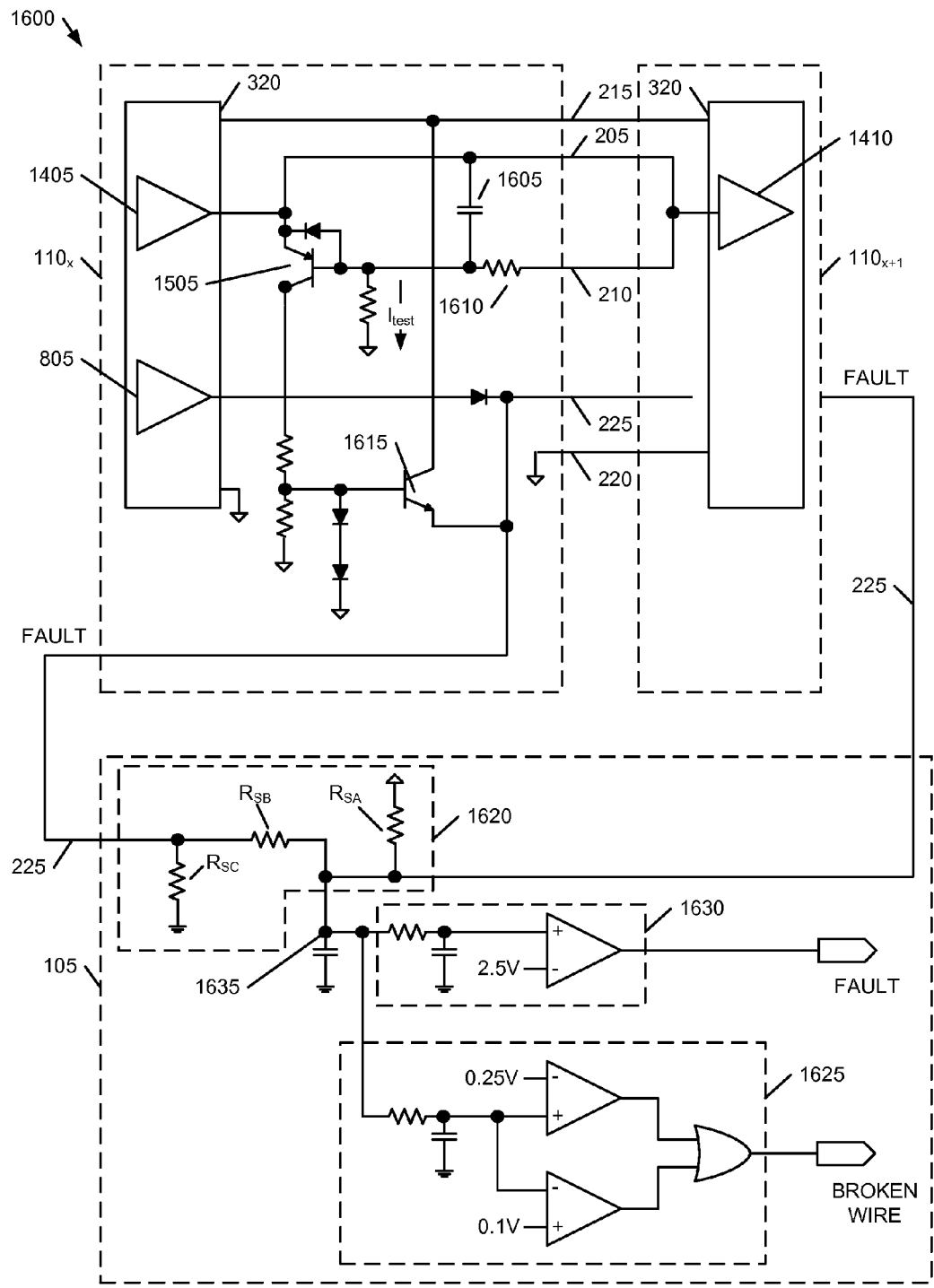
FIG. 16 illustrates a schematic diagram for a more generalized conductor break detection circuit topology as compared to topology 1500 shown in FIG. 15.

FIG. 16 illustrates a schematic diagram for a conductor break detection circuit topology 1600 as compared to topology 1500 shown in FIG. 15. Topology 1600 includes additional mechanisms for the break detector as well as three-level fault signaling to host 105. Additionally, FIG. 16 includes addition of an AC decoupling capacitor 1605 and a damping resistor 1610 to the base-emitter junction of transistor 1505. The fault signaling polarity of FIG. 16 is opposite of the fault signaling polarity shown in FIG. 8. Use of a simple inverter (e.g., another transistor or digital IC or the like) makes either scheme compatible with other.

Topology 1600 includes the redundancy data and redundancy failure signal implementations described herein with a continuous fault break detection signal that allows host 105 to centrally detect any failure of a data or signaling wire anywhere in battery electronics system 100.

Topology 1600 includes an emitter-follower transistor 1615 in client 110$_x$, transistor 1615 having an emitter coupled to power wire 215, a base coupled to the collector of transistor 1505, and a collector coupled to fault signal transmitter 805. Host 105 includes a resistive divider 1620 (e.g., three series resistors $R_{SA}$~49 kΩ, $R_{SB}$~5 kΩ, and $R_{SC}$~1 kΩ), a window comparator 1625, and a fault detector 1630 all coupled to both ends of fault wire 225.

Transistor 1615 applies a voltage to fault wire 225 whenever any data wire fails. This voltage is approximately one diode drop (e.g., ~0.6V). When a fault wire 225 fails, resistive divider 1620 (which also acts as pull-down resistor $R_{pd}$) generates a similar voltage level at a test node 1635. Window comparator 1625 monitors test node 1635 and when the voltage is at level that indicates a break, window comparator 1625 asserts a broken wire signal. (In this case, window comparator 1625 asserts the broken wire signal when the voltage at test node 1635 is not between 0.1V and 0.25V.) Assertion of the broken wire signal is a warning signal that data or fault wire redundancy has been lost somewhere in battery electronics system 100 and is available at host 105.

Window comparator 1625 has the additional function of monitoring the fault wire for short circuits to one of the two power conductors. Any accidental connection, or "short" of the fault wire, can impede its normal function. Since the fault wire signals potentially dangerous conditions by changing its potential (from a low potential to a high potential, in the case of topology 1600), any short that connects the fault wire electrically to a potential that is the same as that potential which an operable fault wire normally uses to signal the absence of dangerous conditions can mask the true presence of dangerous conditions by preventing the fault wire from attaining that potential which is normally used to signal them. In the embodiment described in topology 1600, connection of the fault wire to the ground conductor of the daisy-chain, or to any metallic object which is at or below the potential of the ground conductor, can cause the potentially harmful condition described above. It can be seen that the resistive divider 1620 will cause the fault signal to normally attain a potential that is equal to neither the power conductor nor the ground conductor, but is somewhere in between. In the described topology, the resistive divider 1620 is designed so that the fault wire will normally attain a potential which is between the two thresholds of the window comparator, and preferably equidistant from them. In topology 1600, this potential that the fault wire normally attains when no faults or broken wires are signaled is 0.175V. By implementing a window comparator 1625 that can detect when the potential on the fault wire falls below a lower threshold, here depicted as 0.1V, the window comparator may signal not only when the fault wire has been broken as described above, but also when the fault wire has short-circuited to ground, and is incapable of signaling a fault. This condition of "shorted to ground" may be considered potentially more dangerous than a broken fault wire, since in the first case no fault at all may be signaled while in the latter case it's probable that a fault signal would still reach one of the two intended redundant receivers. Therefore, an implementation may desire to replace the window comparator 1625 depicted herein with two separate level comparators, one of which signals passage of the fault signal through an upper threshold, and the other through a lower threshold. These two thresholds described correspond to the thresholds of 0.1V and 0.25V depicted in topology 1600 and associated with window comparator 1625. The upper threshold comparator would continue to generate a "BROKEN WIRE" signal as is generated by the window comparator in topology 1600, while the lower comparator would now generate a "SHORTED FAULT WIRE" signal: battery host 105 would then be able to react appropriately to these two different conditions.

Should any client $110_x$ generate a true FAULT signal from fault signal transmitter 805, voltage on fault wire 225 rises to a greater level and the voltage at test node 1635 also rises. The voltage at test node 1635 is monitored by fault detector 1630 and when it rises above a second threshold (e.g., 0.25V), fault detector 1630 asserts a FAULT signal. The FAULT signal at host 105 is an alert that one of the N clients $110_x$ has asserted a true FAULT signal.

Figure 17:
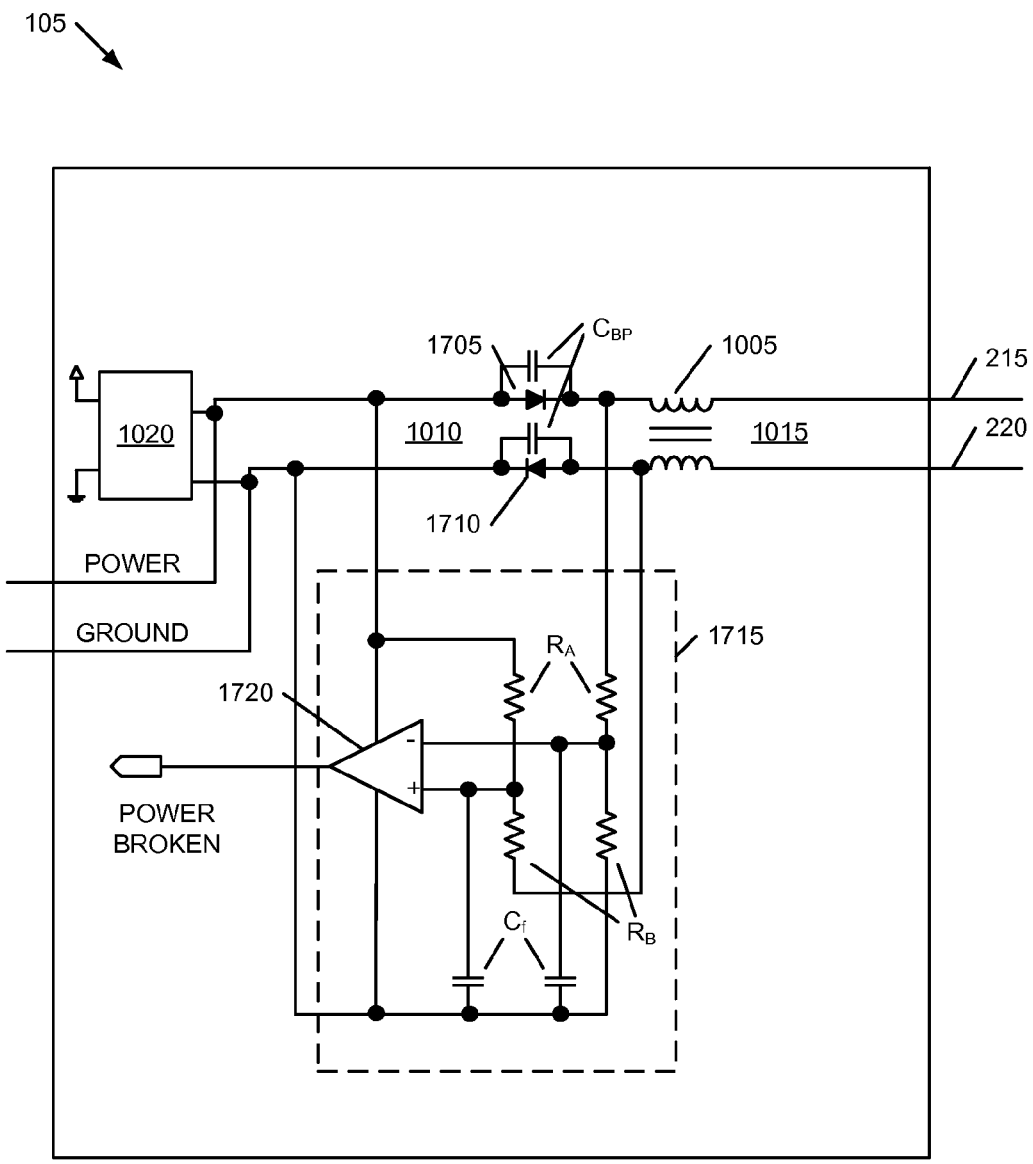
FIG. 17 illustrates a schematic diagram for a power supply conductor break detection circuit topology 1700.

If necessary or desirable, it is possible to incorporate wire break detection on the power supply conductors. FIG. 17 illustrates a schematic diagram for a power supply conductor break detection circuit topology 1700. One way to achieve such wire break detection is by completing the redundant power supply path with a pair of diodes (a first diode 1705 connecting the two ends of the power connections, and a second diode 1710 connecting the two ends of the ground connections). These diodes will normally have no voltage across them, because the main conduction path (the path from DC-DC converter through daisy-chain isolator 1005 and around the loop) will supply current to the entire daisy-chain with little voltage drop. If either power conductor is broken, its associated diode will conduct current, and the forward voltage across this diode may be measured by a comparison circuit 1715. A single differential comparator 1720 would be sufficient to make the measurements of both diode voltages. A few resistors (e.g., $R_A$ and $R_B$, $R_A$ slightly greater than $R_B$ for example $R_A$=50 kΩ and $R_B$=49 kΩ) and capacitors (e.g., a pair of diode bypass transistors $C_{BP}$ and a pair of filter capacitors $C_f$) would be necessary to suppress momentary AC voltages which could be caused by reactive impedance of the power supply conductor loop or induced voltage from EMFs. Generally, a resonant circuit formed between the two diode-bypass capacitors and the power conductor loop will be found to be strongly under-damped. A series C or RC circuit may need to be added between the cathode of the diode on the power-loop and the anode of the ground-loop diode. This pair of diodes could be replaced by base-emitter junctions of bipolar junction transistors, as was done for the data break detection discussed herein. It will likely be found that BJTs whose BE junctions are rated for the necessary current to supply the multiple digital isolators required by the daisy-chain loop are hard to come by, and therefor unlikely to be commodity items, and hence a more expensive solution that typically renders it unsuitable for battery electronics system 100 of an EV.

Figure 18:
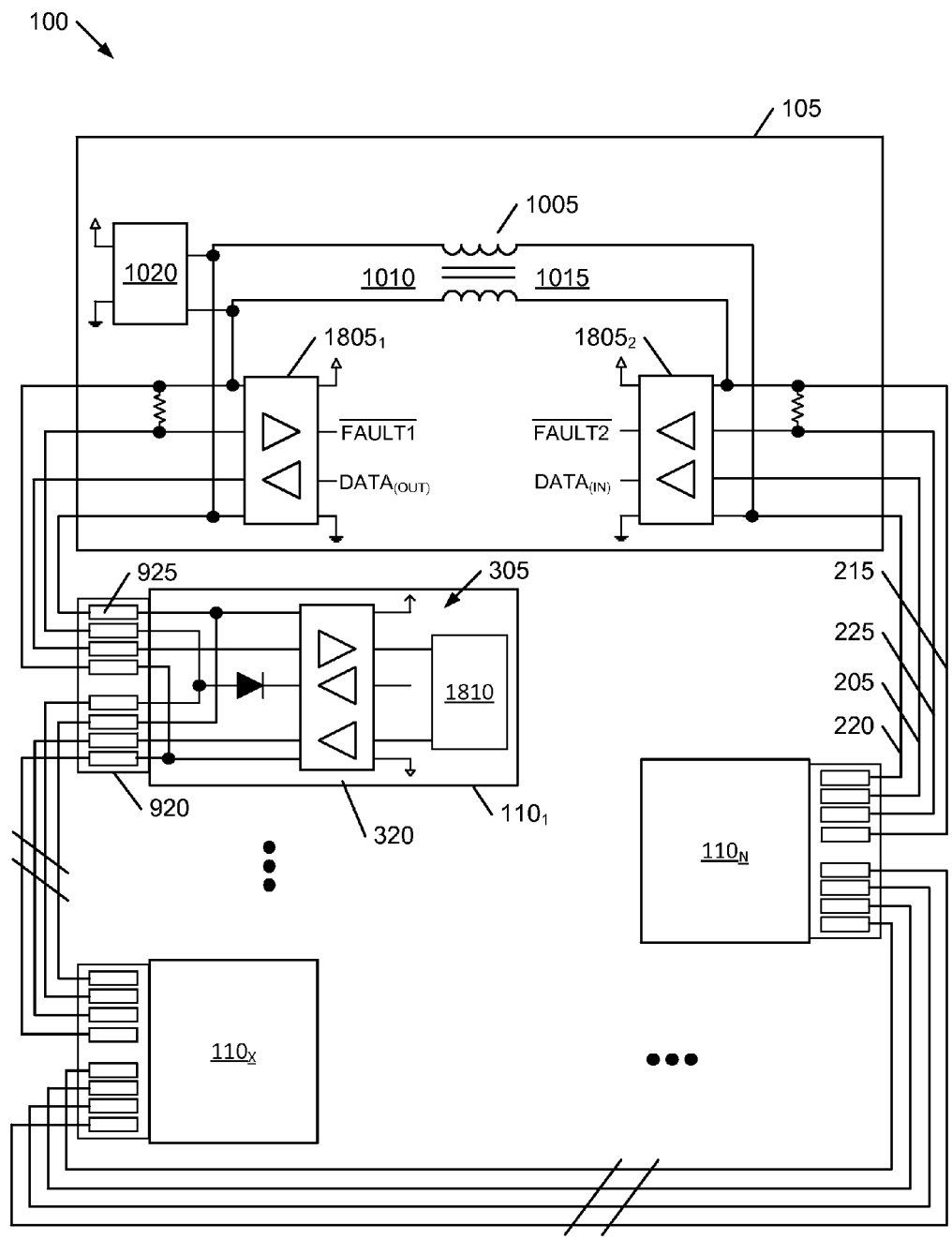
FIG. 18 illustrates a detailed general schematic of an interference rejection portion of a signaling subsystem for a battery communications system similar to FIG. 10 with additional optional details.

FIG. 18 illustrates a detailed general schematic of an interference rejection portion of a signaling subsystem for a battery communications system similar to FIG. 10 with additional optional details. Explicitly included in FIG. 18 is use of a first digital isolator $1805_1$ at first location 1010 and a second digital isolator $1805_2$ at second location 1015 for redundant multistate signaling (e.g., FAULT) and data communications with respect to the communications master of host 105. First digital isolator $1805_1$ supports $FAULT_1$ signaling and transmission of data (DATA(OUT)) to clients 110 and second digital isolator $1805_2$ supports $FAULT_2$ signaling and receipt of data (DATA(IN)) from clients 110. As noted, in some implementations it is desired to have two or more daisy-chain loops for data communications but to simplify FIG. 18, one data daisy-chain loop is illustrated. Also illustrated is a processor 1810 for each client (similar to processor 310) receiving host-initiated communications from an upstream communications device and transmitting to a downstream communications device over the daisy-chain loop and ending back at host 105.

Figure 19:
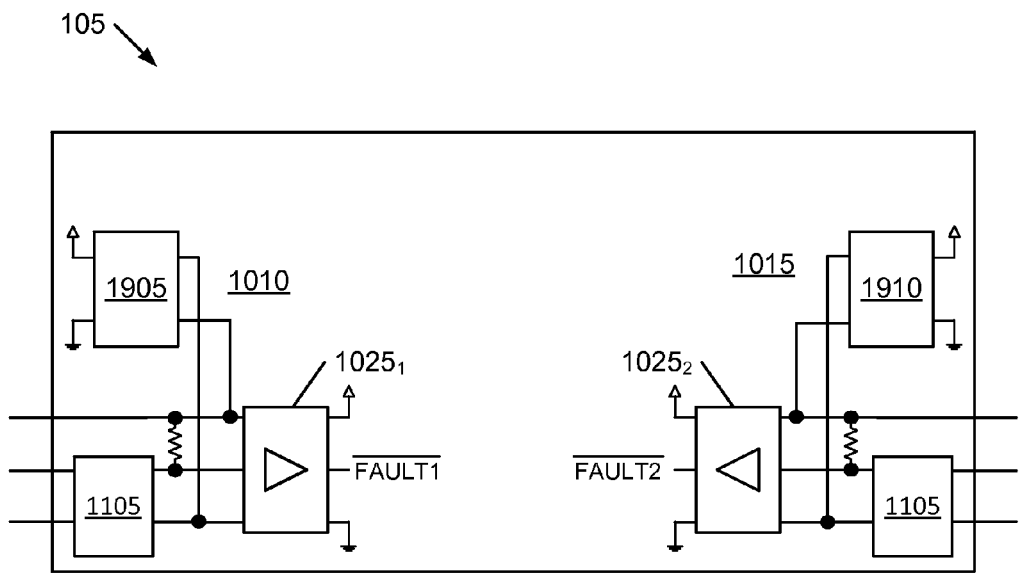
FIG. 19 illustrates an alternate configuration for the host from that shown in FIG. 11 which adds a second host isolated power supply.

FIG. 19 illustrates an alternate configuration for host 105 from that shown in FIG. 11 which includes a first host isolated power supply 1905 at first location 1010 and adds a second host isolated power supply 1910 at second location 1015. Each client 110 is able to receive power from both power supplies, and a single break in one of the conductors does not remove operating power as one of the power supplies will always remain coupled. This powers redundant multistate signaling (e.g., FAULT) at both locations as well.

Figure 20:
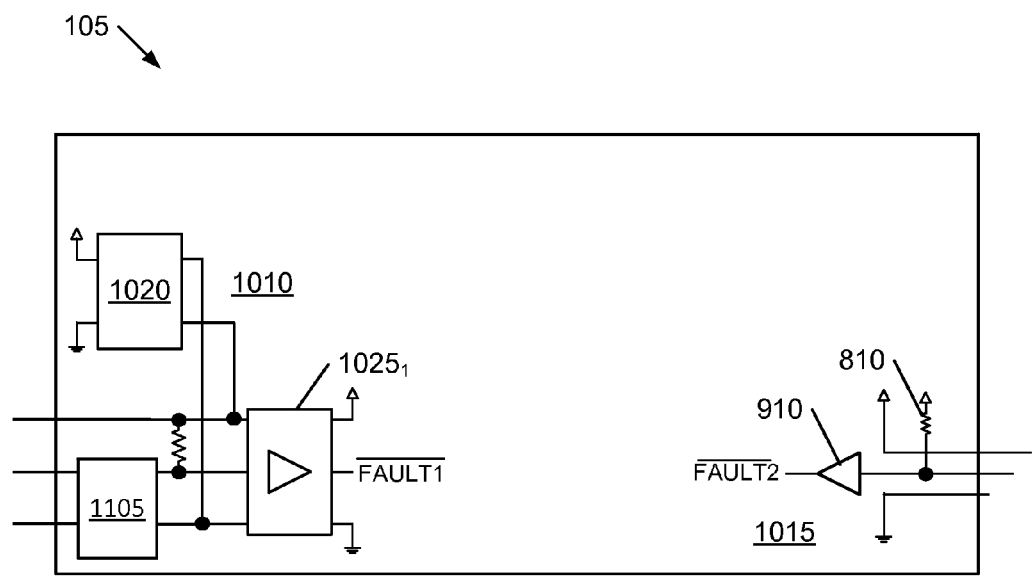
FIG. 20 illustrates an alternate configuration for the host from that shown in FIG. 19.

FIG. 20 illustrates an alternate configuration for host 105 from that shown in FIG. 19. Included in this implementation is use of the simplified fault receiver mechanism of FIG. 9 for the redundant second fault receiver function. This simplified fault receiver arrangement uses a single power supply 1020 and one ground-referenced fault receiver (e.g., receiver 910) and eliminates daisy-chain isolator 1005.

The system and methods above has been described in general terms as an aid to understanding details of preferred embodiments of the present invention. In the description herein, numerous specific details are provided, such as examples of components and/or methods, to provide a thorough understanding of embodiments of the present invention. For example, in the application the term "processor" is used to not only refer to microprocessors, microcontrollers, and other similar organizations of electronic circuitry, but includes for purposes of this application an electronic circuit capable of executing instructions accessed from a memory. Data processing system is sometimes used herein to explicitly connote this broader context, but absent specific context to the contrary, uses of "processor" and similar are not limited to these particular arrangements of electronic circuitry. Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. A data communications system in an electrically noisy environment, comprising:
a plurality of communication devices, said communication devices including a host and a number N of clients, N greater than 1, communicated to said host using a first single data conductor daisy-chain loop wherein said first single data conductor daisy-chain loop originates and terminates at said host and wherein said first single data conductor daisy chain-loop comprises said number N+1 of conductor segments, each particular one conductor segment of said first single data conductor daisy-chain loop communicating an upstream communications device to a downstream communications device;
wherein said first single data conductor daisy-chain loop is routed through a region of the electrically noisy environment having a time-varying magnetic field capable of generating a noise induced signal having a peak magnitude on an order of a threshold magnitude of data signals transmitted over said first single data conductor daisy-chain loop, said first single data conductor daisy-chain loop communicating said communications devices in a first communications order.

2. The data communications system of claim 1 further comprising a second single data conductor daisy-chain loop wherein said second single data conductor daisy-chain loop originates and terminates at said host and wherein said second single data conductor daisy chain-loop comprises said number N+1 of conductor segments, each particular one conductor segment of said second single data conductor daisy-chain loop communicating an upstream communications device to a downstream communications device.

3. The data communications system of claim 2 wherein said first and second single data conductor daisy-chain loops are co-routed through the region of the electrically noisy environment, and wherein the first communications order matches a second communications order of said second single data conductor daisy-chain loop.

4. The data communications system of claim 1 wherein each communications device includes a printed circuit board (PCB) having a connector with a plurality of electrical couplers, a plurality of PCB components, and a plurality of traces communicating said plurality of electrical couplers to one or more of said plurality of PCB components, and wherein a particular one conductor segment of said first single data conductor daisy-chain loop joins a first particular one coupler of said connector of said upstream communications device to a first particular one coupler of said connector of said downstream communications device.

5. The data communications system of claim 4 wherein said plurality of PCB components includes a data processing system and wherein each said PCB includes an isolator electrically disposed between said connector and said data processing system and wherein for each particular PCB said isolator includes a plurality of isolator channels, one isolator channel associated with each coupler of said plurality of couplers of said connector.

6. The data communications system of claim 5 wherein the electrically noisy environment includes an electric vehicle including an electric propulsion motor generating a time-varying magnetic field, said electric vehicle having an energy storage system that includes a management system and a battery pack comprised of said number N of inter-coupled battery modules with said host associated with said management system and each said client associated with one of said inter-coupled battery modules and wherein each said PCB includes an electrical interface, said electrical interface electrically communicating said PCB to said associated battery module.

7. The data communication system of claim 6 further comprising a multi-chip module having a plurality of semiconductor dies packaged into a single semiconductor package wherein said isolator is implemented on one or more separate distinct semiconductor dies disposed within said single semiconductor package and wherein at least a portion of said electrical interface is implemented on one or more separate distinct semiconductor dies disposed within said single semiconductor package.

8. The data communications system of claim 6 wherein said electrical interface includes said data processing system.

9. The data communications system of claim 6 wherein said electrical interface is coupled to said data processing system.

10. The data communications system of claim 2 wherein each communications device includes a printed circuit board (PCB) having a connector with a plurality of electrical couplers, a plurality of PCB components, and a plurality of traces communicating said plurality of electrical couplers to one or more of said plurality of PCB components, wherein a particular one conductor segment of said first single data conductor daisy-chain loop joins a first particular one downstream coupler of said connector of said upstream communications device to a first particular one upstream coupler of said connector of said downstream communications device and wherein a particular one conductor segment of said second single data conductor daisy-chain loop joins a second particular one downstream coupler of said connector of said upstream communications device to a second particular one upstream coupler of said connector of said downstream communications device.

11. The data communications system of claim 10 wherein, for each said PCB, said plurality of couplers include said first upstream coupler, said second upstream coupler, said first downstream coupler, and said second downstream coupler, and wherein said plurality of traces include an upstream data trace coupled to said first and second upstream couplers and a downstream data trace coupled to said first and second downstream couplers.

12. The data communications system of claim 11 wherein said plurality of PCB components includes a data processing system and wherein each said PCB includes an isolator having a first isolator channel and a second isolator channel and each said isolator channel enabling a transmission from a channel input port to a channel output port when active and disabling said transmission when inactive with said channel input port of said first isolator channel coupled to said upstream data trace, said channel output port of said first isolator channel coupled to said data processing system, said channel input port of said second isolator channel coupled to said data processing system, and said channel output port of said second isolator channel coupled to said downstream data trace.

13. The data communications system of claim 1 further comprising a single conductor first voltage power daisy-chain loop and a single conductor second voltage power daisy-chain loop, each said power daisy-chain loop extending from a first location on said host to a second location on said host with each client coupled to each power daisy-chain loop between said locations.

14. The data communications system of claim 13 wherein said host includes a power supply coupled to said first locations of each said power daisy-chain loops.

15. The data communications system of claim 14 wherein said power supply includes an isolated direct current to direct current power converter (DC-DC converter).

16. The data communications system of claim 14 wherein the electrically noisy environment induces alternating current noise signals between said locations, wherein said power supply provides a direct current to each said client using said single conductor power daisy-chain loops to operate a function of each said client, and wherein said host includes a frequency-dependent impedance coupling said first location to said second location, said frequency-dependent impedance passing said direct current from said first location to said second location sufficient to continue to operate said function of said clients from said second location while isolating said alternating current noise signals at one said location from the other said location.

17. The data communications of claim 16 wherein a serial data transmission on said first single data conductor daisy-chain loop is referenced to a first particular one power daisy-chain loop producing a pseudo-differential serial data transmission.

18. The data communications of claim 17 wherein said particular one power daisy-chain loop is co-routed with said first single data conductor daisy-chain loop along a transmission path through a region of the electrically noisy environment having a time-varying magnetic field capable of generating an induced noise signal having a peak magnitude on an order of a threshold magnitude of data signals transmitted over said first single data conductor daisy-chain loop wherein said first single data conductor daisy-chain loop and said particular one power daisy-chain loop are twisted together at least over a portion of said transmission path.

19. The data communications system of claim 2 further comprising a single conductor first voltage power daisy-chain loop and a single conductor second voltage power daisy-chain loop, each said power daisy-chain loop extending from a first location on said host to a second location on said host with each client coupled to each power daisy-chain loop between said locations.

20. The data communications system of claim 19 wherein said host includes a power supply coupled to said first locations of each said power daisy-chain loops.

21. The data communications system of claim 20 wherein said power supply includes an isolated direct current to direct current power converter (DC-DC converter).

22. The data communications system of claim 20 wherein the electrically noisy environment induces alternating current noise signals between said locations, wherein said power supply provides a direct current to each said client using said single conductor power daisy-chain loops to operate a function of each said client, and wherein said host includes a frequency-dependent impedance coupling said first location to said second location, said frequency-dependent impedance passing said direct current from said first location to said second location sufficient to continue to operate said function of said clients from said second location while isolating said alternating current noise signals at one said location from the other said location.

23. The data communications of claim 22 wherein a first serial data transmission on said first single data conductor daisy-chain loop is referenced to a first particular one power daisy-chain loop producing a first pseudo-differential serial data transmission and wherein a second serial data transmission on said second single data conductor daisy-chain loop is referenced to a second particular one power daisy-chain loop producing a second pseudo-differential serial data transmission.

24. The data communications of claim 23 wherein said first particular one power daisy-chain loop is co-routed with said first single data conductor daisy-chain loop along a first transmission path through the region of the electrically noisy environment, wherein said first single data conductor daisy-chain loop and said first particular one power daisy-chain loop are twisted together at least over a portion of said first transmission path forming a first twisted conductor pair and wherein said second particular one power daisy-chain loop is co-routed with said second single data conductor daisy-chain loop along a second transmission path through another region of the electrically noisy environment having another time-varying magnetic field capable of generating another noise induced signal having another noise magnitude on an order of a data magnitude of data signals over said second single data conductor daisy-chain loop wherein said second single data conductor daisy-chain loop and said second particular one power daisy-chain loop are twisted together at least over a portion of said second transmission path forming a second twisted conductor pair.

25. The data communications of claim 24 wherein said first transmission path and said second transmission path are at least partially co-routed through the electrically noisy environment at a co-route and wherein said first twisted conductor pair is twisted with said second twisted conductor pair along a portion of said co-route.

26. The data communications system of claim 19 wherein said client includes a power supply coupled to each of said power daisy-chain loops.

27. A data communications system in an electrically noisy environment, comprising:
   a host, and a client communicated to said host using a first single data conductor daisy-chain loop wherein said first single data conductor daisy-chain loop originates at a first location at said host and terminates at a second location at said host and wherein said first single data conductor daisy chain-loop comprises a first conductor segment communicating said first location to said client and a second conductor segment communicating said client to said second location;
   wherein said first single data conductor daisy-chain loop is routed through a region of the electrically noisy environment having a time-varying magnetic field capable of generating a noise induced signal having a peak magnitude on an order of a threshold magnitude of data signals transmitted over said first single data conductor daisy-chain loop, said first single data conductor daisy-chain loop communicating said host and client in a first communications order.

28. The data communications system of claim 27 further comprising a second single data conductor daisy-chain loop wherein said second single data conductor daisy-chain loop originates at said first location and terminates at said second location and wherein said second single data conductor daisy chain-loop comprises a first conductor segment communicating said first location to said client and a second conductor segment communicating said client to said second location.

29. A data communications method for a plurality of communication devices including a host and a number N, N>=1, of clients in an electrically noisy environment, comprising:
   a) transmitting a data packet using a first serial data transmission through the electrically noisy environment over a first single data conductor daisy-chain loop referenced to a single conductor first voltage power daisy-chain loop as a first pseudo-differential signal with said loop extending from the host to each client and back to the host, wherein said first single data conductor daisy-chain loop is routed through a region of the electrically noisy environment having a time-varying magnetic field capable of generating a noise induced signal having a peak magnitude on an order of a threshold magnitude of data signals transmitted over said first single data conductor daisy-chain loop, said first single data conductor daisy-chain loop communicating said communications devices in a first communications order;
   b) receiving, at each client, said data packet over said first single data conductor daisy-chain loop; and
   c) transmitting, from each client, said data packet over said first single data conductor daisy-chain loop.

30. The data communications method of claim 29 further comprising:
   d) receiving said data packet using a second serial data transmission through the electrically noisy environment over a second single data conductor daisy-chain loop referenced to a single conductor second voltage power daisy-chain loop as a second pseudo-differential signal with said second single data conductor daisy-chain loop extending from the host to each client and back to the host; and
   e) transmitting, at each client, said data packet over said second single data conductor daisy-chain loop.

* * * * *